(12) United States Patent
Okazaki et al.

(10) Patent No.: US 11,374,117 B2
(45) Date of Patent: Jun. 28, 2022

(54) METHOD FOR MANUFACTURING SEMICONDUCTOR DEVICE

(71) Applicant: Semiconductor Energy Laboratory Co., Ltd., Atsugi (JP)

(72) Inventors: Kenichi Okazaki, Tochigi (JP); Yukinori Shima, Tatebayashi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/971,061

(22) PCT Filed: Feb. 22, 2019

(86) PCT No.: PCT/IB2019/051445
§ 371 (c)(1),
(2) Date: Aug. 19, 2020

(87) PCT Pub. No.: WO2019/166925
PCT Pub. Date: Sep. 6, 2019

(65) Prior Publication Data
US 2021/0005738 A1   Jan. 7, 2021

(30) Foreign Application Priority Data
Mar. 1, 2018 (JP) .............................. JP2018-036838

(51) Int. Cl.
*H01L 29/786* (2006.01)
*H01L 29/66* (2006.01)
(Continued)

(52) U.S. Cl.
CPC ...... *H01L 29/66969* (2013.01); *G02F 1/1368* (2013.01); *H01L 21/426* (2013.01);
(Continued)

(58) Field of Classification Search
CPC ......... H01L 21/02123; H01L 21/02164; H01L 21/02271; H01L 21/02274;
(Continued)

(56) References Cited

U.S. PATENT DOCUMENTS 10,158,008 B2   12/2018   Koezuka et al.
10,361,290 B2    7/2019   Yamazaki et al.
(Continued)

FOREIGN PATENT DOCUMENTS

JP   2001-210630 A   8/2001
JP   2014-007399 A   1/2014
(Continued)

OTHER PUBLICATIONS

International Search Report (Application No. PCT/IB2019/051445) dated May 28, 2019.
(Continued)

*Primary Examiner* — Cheung Lee
(74) *Attorney, Agent, or Firm* — Robinson Intellectual Property Law Office; Eric J. Robinson

(57) ABSTRACT

A semiconductor device having favorable electrical characteristics is provided. The semiconductor device is manufactured by a first step of forming a semiconductor layer containing a metal oxide, a second step of forming a first insulating layer, a third step of forming a first conductive film over the first insulating layer, a fourth step of etching part of the first conductive film to form a first conductive layer, thereby forming a first region over the semiconductor layer that overlaps with the first conductive layer and a second region over the semiconductor layer that does not overlap with the first conductive layer, and a fifth step of performing first treatment on the conductive layer. The first treatment is plasma treatment in an atmosphere including a mixed gas of a first gas containing an oxygen element but
(Continued)

not containing a hydrogen element, and a second gas containing a hydrogen element but not containing an oxygen element.

14 Claims, 16 Drawing Sheets

(51) Int. Cl.
| | |
|---|---|
| *G02F 1/1368* | (2006.01) |
| *H01L 21/426* | (2006.01) |
| *H01L 21/4763* | (2006.01) |
| *H01L 27/12* | (2006.01) |
| *H01L 21/02* | (2006.01) |
| *H01L 21/385* | (2006.01) |

(52) U.S. Cl.
CPC ...... *H01L 21/47635* (2013.01); *H01L 27/127* (2013.01); *H01L 27/1225* (2013.01); *G02F 1/13685* (2021.01); *H01L 21/0214* (2013.01); *H01L 21/02274* (2013.01); *H01L 21/385* (2013.01); *H01L 27/1229* (2013.01); *H01L 27/1255* (2013.01)

(58) Field of Classification Search
CPC ......... H01L 21/02315; H01L 21/02518; H01L 21/02554; H01L 21/02565; H01L 21/02612; H01L 21/02631; H01L 21/44; H01L 21/441; H01L 21/443; H01L 21/47635; H01L 27/1214; H01L 27/1225; H01L 27/1259; H01L 27/1262; H01L 29/45; H01L 29/66007; H01L 29/66969; H01L 29/786; H01L 29/7869; H01L 29/78696; H01L 21/0214; H01L 21/426
See application file for complete search history.

(56) References Cited

U.S. PATENT DOCUMENTS

| | | |
|---|---|---|
| 2001/0034125 A1 | 10/2001 | Uozumi |
| 2010/0207118 A1* | 8/2010 | Sakata ............... H01L 29/7869 |
| | | 257/43 |
| 2011/0127521 A1 | 6/2011 | Yamazaki |
| 2013/0270549 A1 | 10/2013 | Okazaki et al. |
| 2013/0320334 A1 | 12/2013 | Yamazaki et al. |
| 2014/0183529 A1 | 7/2014 | Yamazaki et al. |
| 2015/0263141 A1 | 9/2015 | Yamazaki et al. |
| 2016/0322416 A1 | 11/2016 | Nara |
| 2017/0104089 A1 | 4/2017 | Koezuka et al. |
| 2017/0104090 A1 | 4/2017 | Koezuka et al. |
| 2019/0326420 A1 | 10/2019 | Yamazaki et al. |

FOREIGN PATENT DOCUMENTS

| | | |
|---|---|---|
| JP | 2015-188079 A | 10/2015 |
| JP | 2017-076787 A | 4/2017 |
| JP | 2017-076788 A | 4/2017 |
| JP | 2017-204637 A | 11/2017 |
| TW | 201724181 | 7/2017 |
| WO | WO-2017/064590 | 4/2017 |
| WO | WO-2019/142080 | 7/2019 |

OTHER PUBLICATIONS

Written Opinion (Application No. PCT/IB2019/051445) dated May 28, 2019.

* cited by examiner

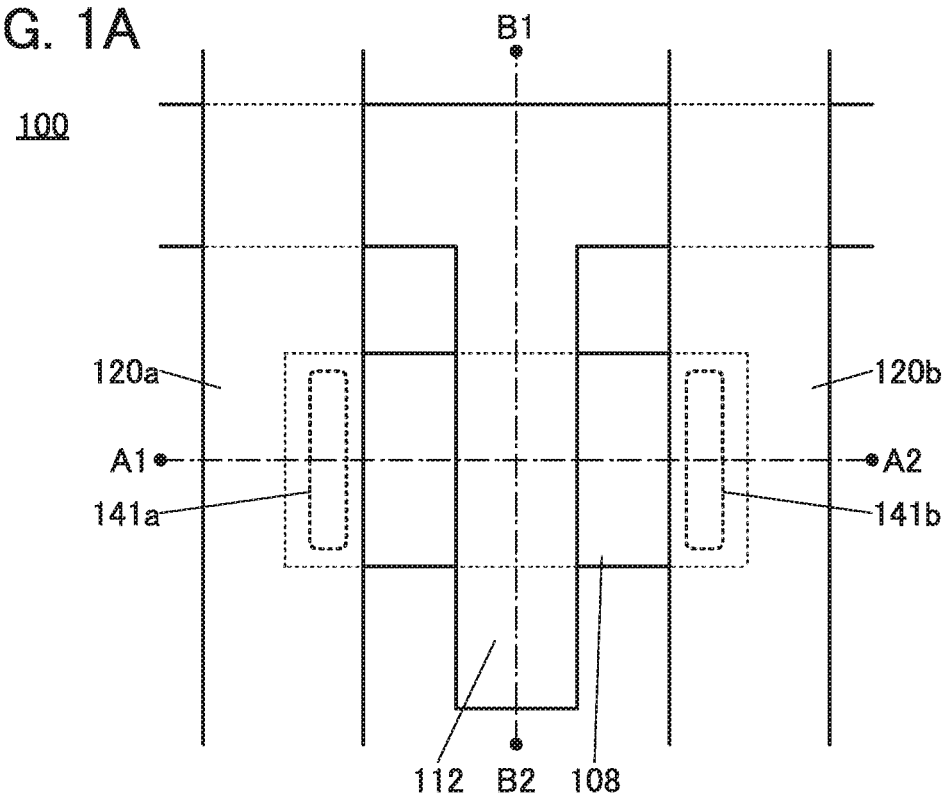
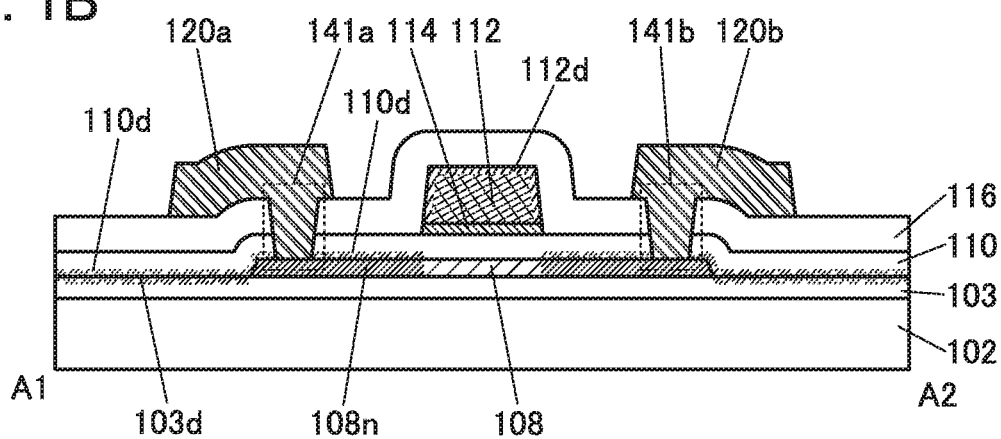
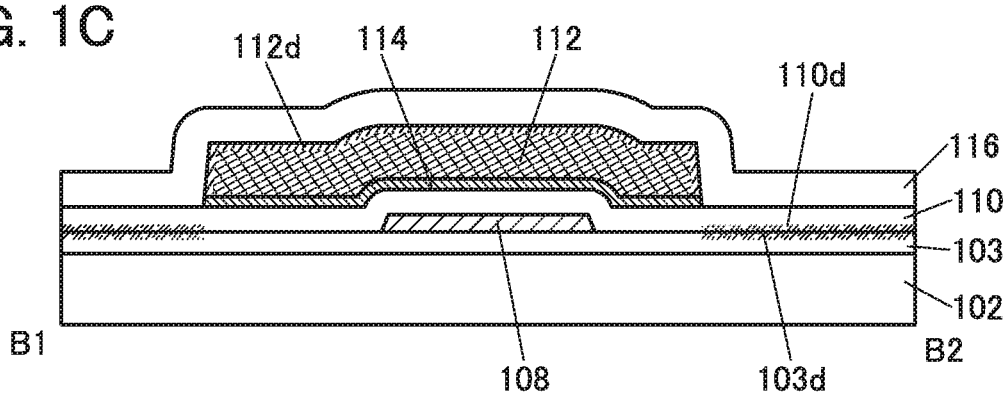

METHOD FOR MANUFACTURING SEMICONDUCTOR DEVICE

TECHNICAL FIELD

One embodiment of the present invention relates to a semiconductor device and a method for manufacturing the semiconductor device. One embodiment of the present invention relates to a transistor and a method for manufacturing the transistor.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has attracted attention. For example, Patent Document 1 discloses a semiconductor device achieving high field-effect mobility (in some cases, simply referred to as mobility or FE) with a structure where a plurality of oxide semiconductor layers are stacked, and among them, the oxide semiconductor layer serving as a channel contains indium and gallium and has a higher indium content than a gallium content.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. Furthermore, a transistor using a metal oxide has higher field-effect mobility than a transistor using amorphous silicon; therefore, a high-performance display device provided with a driver circuit can be achieved.

Patent Document 2 discloses a semiconductor device using a low-resistance conductive material. Patent Document 2 discloses a formation method of copper, which is a low-resistance conductive material.

PRIOR ART DOCUMENTS

Patent Documents

[Patent Document 1] Japanese Published Patent Application No. 2014-7399
[Patent Document 2] Japanese Published Patent Application No. 2001-210630

SUMMARY OF THE INVENTION

Problems to be Solved by the Invention

An object of one embodiment of the present invention is to provide a semiconductor device having favorable electrical characteristics, and a manufacturing method thereof. Another object is to provide a semiconductor device having stable electrical characteristics, and a manufacturing method thereof. Another object is to provide a highly reliable display device.

Note that the description of these objects does not disturb the existence of other objects. Note that one embodiment of the present invention does not need to achieve all these objects. Note that objects other than these can be derived from the description of the specification, the drawings, the claims, and the like.

Means for Solving the Problems

One embodiment of the present invention includes a first step of forming a semiconductor layer containing a metal oxide, a second step of forming a first insulating layer covering the semiconductor layer, a third step of forming a first conductive film over the first insulating layer, a fourth step of etching part of the first conductive film to form a first conductive layer, thereby forming a first region over the semiconductor layer that overlaps with the first conductive layer and a second region over the semiconductor layer that does not overlap with the first conductive layer, a fifth step of performing first treatment on the first conductive layer, and a sixth step of forming a second insulating layer containing an oxide, the second insulating layer being in contact with the first conductive layer. The first conductive layer contains copper, silver, gold, or aluminum. The first treatment is plasma treatment in an atmosphere including a mixed gas of a first gas containing an oxygen element but not containing a hydrogen element, and a second gas containing a hydrogen element but not containing an oxygen element; and the second insulating layer is formed by a plasma-enhanced chemical vapor deposition method using a film formation gas containing the first gas and a third gas containing a silicon element. The sixth step is performed successively after the fifth step without exposure to the air.

Another embodiment of the present invention includes a first step of forming a semiconductor layer containing a metal oxide, a second step of forming a first insulating layer covering the semiconductor layer, a third step of forming a first metal oxide film and a first conductive film in this order over the first insulating layer, a fourth step of etching part of the first conductive film and part of the first metal oxide film to form a first conductive layer and a first metal oxide layer, thereby forming a first region over the semiconductor layer that overlaps with the first conductive layer and a second region over the semiconductor layer that does not overlap with the first conductive layer, a fifth step of performing first treatment on the first conductive layer, and a sixth step of forming a second insulating layer containing an oxide, the second insulating layer being in contact with the first conductive layer. The first conductive layer contains copper, silver, gold, or aluminum. The first treatment is plasma treatment in an atmosphere including a mixed gas of a first gas containing an oxygen element but not containing a hydrogen element, and a second gas containing a hydrogen element but not containing an oxygen element; and the second insulating layer is formed by a plasma-enhanced chemical vapor deposition method using a film formation gas containing the first gas and a third gas containing a silicon element. The sixth step is performed successively after the fifth step without exposure to the air.

In the above, preferably, the first treatment in the fifth step is performed while the flow rates of the first gas and the second gas supplied to a treatment chamber are controlled such that the flow rate of the second gas is higher than or equal to 0.5% and lower than or equal to 100% with the flow rate of the first gas being 100%.

In the above, preferably, the first gas contains $N_2O$ or $O_2$ whereas the second gas contains $NH_3$ or $H_2$.

In the above, preferably, the semiconductor layer is formed in the first step in such a manner that a second metal oxide film and a third metal oxide film are formed in this order and then processed by etching, and the third metal oxide layer is formed so as to have higher crystallinity than the second metal oxide layer.

In the above, preferably, a seventh step of forming a first conductive layer is included before the first step, an eighth step of forming a third insulating layer covering the first conductive layer is included between the seventh step and the first step, and the semiconductor layer is formed in the first step so as to overlap with the first conductive layer.

Effect of the Invention

According to one embodiment of the present invention, a semiconductor device having favorable electrical characteristics, and a manufacturing method thereof can be provided. A semiconductor device having stable electrical characteristics, and a manufacturing method thereof can be provided. According to one embodiment of the present invention, a highly reliable display device can be provided.

Note that the description of these effects does not disturb the existence of other effects. Note that one embodiment of the present invention does not need to have all the effects. Note that effects other than these can be derived from the description of the specification, the drawings, the claims, and the like.

BRIEF DESCRIPTION OF THE DRAWINGS

FIGS. 1 (A), (B), and (C) are structure examples of a transistor.

MODE FOR CARRYING OUT THE INVENTION

Figure 2A:
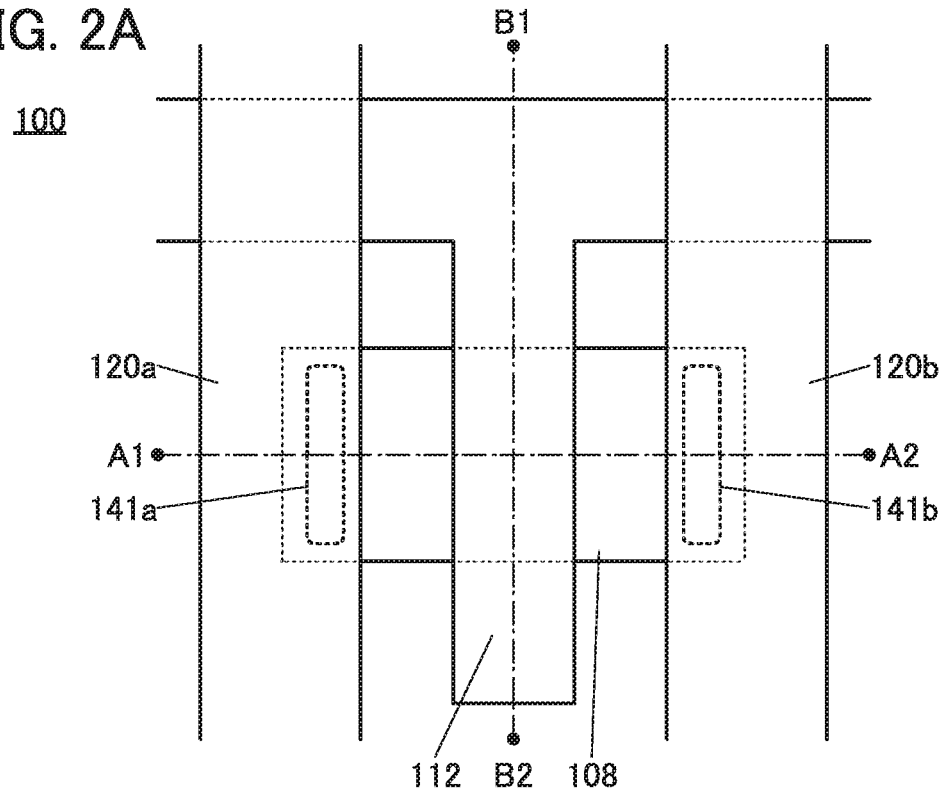
FIGS. 2 (A), (B), and (C) are structure examples of a transistor.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In each drawing described in this specification, the size, the layer thickness, or the region of each component is exaggerated for clarity in some cases.

Ordinal numbers such as "first", "second", and "third" used in this specification are used in order to avoid confusion among components, and the terms do not limit the components numerically.

In this specification, terms for describing arrangement, such as "over" and "under", are used for convenience to describe the positional relationship between components with reference to drawings. Furthermore, the positional relationship between components is changed as appropriate in accordance with a direction in which the components are described. Thus, without limitation to terms used in the specification, the description can be changed appropriately depending on the situation.

In this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

In this specification and the like, a channel length direction of a transistor refers to one of the directions parallel to a straight line that connects a source region and a drain region in the shortest distance. In other words, a channel length direction corresponds to one of the directions of current flowing through a semiconductor layer when a transistor is in an on state. A channel width direction refers to a direction orthogonal to the channel length direction. Note that each of the channel length direction and the channel width direction is not fixed to one direction in some cases depending on the structure and the shape of a transistor.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film", respectively.

Unless otherwise specified, an off-state current in this specification and the like refers to drain current of a transistor in an off state (also referred to as a non-conducting state or a cutoff state). Unless otherwise specified, an off state refers to, in an n-channel transistor, a state where the voltage $V_{gs}$ between its gate and source is lower than the threshold voltage $V_{th}$ (in a p-channel transistor, higher than $V_{th}$).

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

In this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Therefore, the touch panel is one embodiment of an input/output device.

A touch panel can also be referred to as, for example, a display panel (or a display device) with a touch sensor or a display panel (or a display device) having a touch sensor function. A touch panel can include a display panel and a touch sensor panel. Alternatively, a touch panel can have a function of a touch sensor inside a display panel or on a surface thereof.

Furthermore, in this specification and the like, a substrate of a touch panel to which a connector or an IC is attached is referred to as a touch panel module, a display module, or simply a touch panel or the like in some cases.

Embodiment 1

In this embodiment, a semiconductor device and a display device of one embodiment of the present invention and a manufacturing method thereof will be described.

One embodiment of the present invention is a transistor including, over a formation surface, a semiconductor layer in which a channel is formed, a gate insulating layer (also referred to as a first insulating layer) over the semiconductor layer, and a conductive layer (also referred to as a first conductive layer) functioning as a gate electrode over the gate insulating layer. The semiconductor layer preferably contains a metal oxide exhibiting semiconductor characteristics (hereinafter also referred to as an oxide semiconductor). Note that the gate insulating layer is preferably an insulating layer containing an oxide.

A low-resistance material is preferably used for the conductive layer in order to improve the electrical characteristics of the transistor. For example, the use of a low-resistance material for a gate electrode, or a source or a drain of a transistor, a wiring connecting transistors, or the like reduces the parasitic capacitance to achieve a transistor and a semiconductor device with favorable electrical characteristics.

The main component of the low-resistance material is preferably, for example, any one of copper, silver, gold, and aluminum. In particular, copper or aluminum is preferable because of its high mass-productivity. Note that copper is more likely to be oxidized than silver and gold. Oxidized copper has a high resistance and might adversely affect the electrical characteristics or reliability of a transistor or a semiconductor device including a plurality of transistors.

Embodiment 1 describes an example of using a conductive layer mainly containing copper for a gate electrode. As a method for inhibiting oxidation of the gate electrode, plasma treatment is performed using a mixed gas of an oxygen-containing gas and a gas having a reducing property. This enables oxidation of the gate electrode to be inhibited.

More specifically, plasma treatment is performed on the surface of the gate electrode in an atmosphere including a mixed gas of a first gas containing an oxygen element but not containing a hydrogen element and a second gas containing a hydrogen element but not containing an oxygen element. As the first gas, for example, nitrogen oxide such as $N_2O$ (nitrous oxide or dinitrogen monoxide), $NO_2$ (nitrogen dioxide), or NO (nitric oxide), or a gas containing $O_2$ (oxygen), $O_3$ (ozone), or the like is preferably used. As the second gas, for example, a gas containing $NH_3$ (ammonia), $H_2$ (hydrogen), or the like is preferably used. It is particularly preferable to use, as a mixed gas used for the plasma treatment, a mixed gas containing $N_2$ (nitrogen) or a rare gas such as Ar in addition to $N_2O$ and $NH_3$.

The proportions of the first gas and the second gas in the mixed gas can be controlled by controlling the flow rate of each gas supplied to a treatment chamber for the plasma treatment. Note that the ratio between two kinds of gases in a mixed gas can be expressed in, for example, the volume ratio, the partial pressure ratio, or the weight ratio. Here, the flow rate ratio between the two kinds of gases supplied to the treatment chamber is substantially the same as the volume ratio and the partial pressure ratio between the two kinds of gases.

Here, when the proportion of the second gas is too low (the flow rate is too small), an oxidation reaction becomes predominant over a reduction reaction, and an oxide is generated on the surface of the gate electrode. By contrast, when the proportion of the second gas is too high, an excess hydrogen element in the second gas may diffuse into a channel formation region in the semiconductor layer through the gate insulating layer to increase the carrier density in the semiconductor layer. Thus, the flow rate of the second gas is preferably at least lower than or equal to the flow rate of the first gas. Then, the amount of a hydrogen element supplied to the semiconductor layer can be reduced. This is probably because even in the case where the unreacted excess hydrogen element contained in the second gas exists, the excess hydrogen element reacts with an oxygen element contained in the first gas to be released from the treatment chamber in a state of hydroxide.

As for the flow rate ratio between the first gas and the second gas, when the flow rate of the first gas is 100%, the flow rate of the second gas can be higher than or equal to 0.5% and lower than or equal to 100%, preferably higher than or equal to 1% and lower than or equal to 90%, further preferably higher than or equal to 3% and lower than or equal to 80%, still further preferably higher than or equal to 3% and lower than or equal to 60%, and still further preferably higher than or equal to 3% and lower than or equal to 50%.

It is preferable that, after the above plasma treatment is performed, an insulating layer containing an oxide is formed successively without exposure to the air. The formation of the insulating layer is preferably conducted by a plasma-enhanced chemical vapor deposition (plasma CVD) method. At this time, the plasma treatment and the formation of the insulating layer are preferably performed successively in the same deposition chamber of the same apparatus. In addition, the plasma treatment and the formation of the insulating layer are preferably performed at the same temperature.

As a film formation gas for forming the insulating layer containing an oxide, a mixed gas containing a deposition gas containing a silicon element or the like and the first gas used for the above plasma treatment is preferably used. Using the same gas that contains an oxygen element for the plasma treatment and the formation of the insulating layer can make the interface between the gate insulating layer and the insulating layer favorable. An $N_2O$ gas is used as the first gas, and a mixed gas containing the $N_2O$ gas and an $SiH_4$ (silane) gas is used as the film formation gas, for example, whereby a silicon oxynitride layer can be formed.

In the case where copper is used as the low-resistance material, a barrier layer is preferably provided so as to inhibit malfunction of the transistor due to diffusion of a copper atom into the insulating layer containing an oxide. That is, when the conductive layer mainly containing copper is covered with the barrier layer, the conductive layer can be separated from the insulating layer. As the barrier layer, for example, titanium nitride, tantalum nitride, or tungsten nitride can be used. Note that in the case where the barrier layer is formed over the conductive layer mainly containing copper, a step of removing an oxidized part of the conductive layer mainly containing copper is required in some cases.

In the aforementioned plasma treatment, diffusion of a copper atom into the insulating layer can be inhibited even without the barrier layer over the conductive layer mainly containing copper. It is also possible to inhibit oxidation that occurs when the silicon oxynitride layer is formed over the conductive layer. That is, the plasma treatment does not require a step of removing the oxidized part of the conductive layer and a step of forming the barrier layer; oxidation of the conductive layer mainly containing copper can be easily inhibited only by performing the plasma treatment before forming the silicon oxynitride layer over the conductive layer.

Note that it is preferable to provide a metal oxide layer between the gate insulating layer and the gate electrode; the metal oxide layer has a function of a barrier layer where a copper atom diffuses into the gate insulating layer and a function of a barrier layer that prevents oxygen contained in the gate insulating layer from being absorbed into the gate electrode. The metal oxide layer also functions as a barrier layer that prevents diffusion of hydrogen and water contained in the gate electrode into the gate insulating layer side. For the metal oxide layer, a material that is less likely to transmit oxygen and hydrogen than at least the gate insulating layer can be used, for example. Note that the metal oxide layer is preferably processed so as to have substantially the same top surface shape as the gate electrode.

Note that in this specification and the like, the expression "having substantially the same top surface shapes" means that at least outlines of stacked layers partly overlap with each other. For example, the case of processing or partly processing an upper layer and a lower layer with the use of the same mask pattern is included. However, in some cases, the outlines do not completely overlap with each other and the upper layer is positioned on an inner side of the lower layer or the upper layer is positioned on an outer side of the lower layer; such a case is also represented by the expression "having substantially the same top surface shapes".

Next, a semiconductor layer is described. The gate insulating layer is preferably provided in contact with atop surface and a side surface of the semiconductor layer processed into an island shape. In addition, especially in the case where a metal oxide is used for the semiconductor layer, the gate insulating layer preferably contains an oxide.

The semiconductor layer includes a channel formation region where a channel can be formed and a pair of low-resistance regions functioning as a source region and a drain region. The channel formation region is a region of the semiconductor layer that overlaps with the gate electrode. In addition, the pair of low-resistance regions is provided with the channel formation region therebetween and has lower resistance than the channel formation region.

The pair of low-resistance regions preferably contains an impurity element. Examples of the impurity element include hydrogen, boron, carbon, nitrogen, fluorine, phosphorus, sulfur, arsenic, aluminum, magnesium, silicon, and a rare gas element. Note that typical examples of the rare gas element include helium, neon, argon, krypton, and xenon. In particular, boron or phosphorus is preferably contained.

In particular, the pair of low-resistance regions preferably contains an impurity element that is likely to be bonded to oxygen. Examples of such an impurity element include boron, phosphorus, aluminum, magnesium, and silicon.

The impurity element is preferably contained also in a portion of the gate insulating layer that is in contact with the pair of low-resistance regions, i.e., a portion of the gate insulating layer that does not overlap with the gate electrode. Furthermore, it is preferable that the impurity not be added to a portion of the gate insulating layer that is in contact with the channel formation region, i.e., a portion of the gate insulating layer that overlaps with the gate electrode.

A this time, the impurity element is preferably supplied by a plasma ion doping method or an ion implantation method. These methods can easily adjust the depth at which ions are added, allowing ions to be easily added to a region including the gate insulating layer and the semiconductor layer.

For example, the low-resistance region of the semiconductor layer preferably includes a region where the impurity concentration is higher than or equal to $1 \times 10^{19}$ atoms/cm$^3$ and lower than or equal to $1 \times 10^{23}$ atoms/cm$^3$, preferably higher than or equal to $1 \times 10^{20}$ atoms/cm$^3$ and lower than or equal to $1 \times 10^{22}$ atoms/cm$^3$. In addition, the low-resistance region of the semiconductor layer preferably includes a region having a higher impurity concentration than a region of the gate insulating layer that is in contact with the low-resistance region. Accordingly, the low-resistance region can have an extremely low resistance.

In addition, a region of the gate insulating layer that does not overlap with the gate electrode preferably includes a region where the impurity concentration is lower than that in the low-resistance region and higher than that in a region of the gate insulating layer that overlaps with the gate electrode.

In the case where an element that is likely to be bonded to oxygen is used as the impurity element, the impurity element exists in a state of being bonded to oxygen in the semiconductor layer. In other words, the impurity element takes oxygen in the semiconductor layer away to cause oxygen vacancies in the semiconductor layer, the oxygen vacancies are bonded to hydrogen in a film, and thus, carriers are generated. Furthermore, an impurity element in the semiconductor layer exists stably in an oxidized state; thus, the impurity element is not desorbed by heat or the like applied during the process, which makes it possible to achieve a low-resistance region that has a low resistance stably. For example, even when a temperature of higher than or equal to 400° C., higher than or equal to 600° C., or higher than or equal to 800° C. is applied during the process, a stable low-resistance region can be maintained.

As the impurity element, an element that is stabilized by being bonded to oxygen in the semiconductor layer and in the gate insulating layer is preferably used. For example, an element, an oxide of which can exist as a solid in a normal state, is preferably used. A particularly preferable element can be selected from a typical non-metal element other than a rare gas and hydrogen, a typical metal element, and a transition metal element. It is particularly preferable to use boron, phosphorus, aluminum, magnesium, silicon, or the like.

More specific examples will be described below with reference to drawings.

Structure Example 1

FIG. 1(A) is a top view of a transistor 100, FIG. 1(B) corresponds to a cross-sectional view of a cut plane along the dashed-dotted line A1-A2 in FIG. 1(A), and FIG. 1(C) corresponds to a cross-sectional view of a cut plane along the dashed-dotted line B1-B2 in FIG. 1(A). Note that in FIG. 1(A), some components (e.g., a gate insulating layer) of the transistor 100 are not illustrated. The direction of the dashed-dotted line A1-A2 corresponds to a channel length direction, and the direction of the dashed-dotted line B1-B2 corresponds to a channel width direction. Some components are not illustrated in top views of transistors in the following drawings, as in FIG. 1(A).

The transistor 100 is provided over a substrate 102 and includes an insulating layer 103, a semiconductor layer 108, an insulating layer 110, a metal oxide layer 114, a conductive layer 112, an insulating layer 116, and the like. An island-shaped semiconductor layer 108 is provided over the insulating layer 103. The insulating layer 110 is provided in contact with atop surface of the insulating layer 103 and a top surface and a side surface of the semiconductor layer 108. The metal oxide layer 114 and the conductive layer 112 are provided to be stacked in that order over the insulating layer 110 and include portions overlapping with the semiconductor layer 108. The insulating layer 116 is provided to cover atop surface of the insulating layer 110, a side surface of the metal oxide layer 114, and atop surface of the conductive layer 112.

Part of the conductive layer 112 functions as agate electrode. Part of the insulating layer 110 functions as agate insulating layer. The transistor 100 is what is called atop-gate transistor, in which the gate electrode is provided over the semiconductor layer 108.

As shown in FIGS. 1(A) and 1(B), the transistor 100 may include a conductive layer 120a and a conductive layer 120b over the insulating layer 116. The conductive layer 120a and the conductive layer 120b function as a source electrode and a drain electrode. The conductive layer 120a and the conductive layer 120b are electrically connected to regions 108n described later through an opening portion 141a and an opening portion 141b, respectively, which are provided in the insulating layer 116 and the insulating layer 110.

The semiconductor layer 108 preferably contains a metal oxide.

The semiconductor layer 108 preferably contains indium, M (M is one kind or a plurality of kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one kind or a plurality of kinds selected from aluminum, gallium, yttrium, and tin.

It is particularly preferable to use an oxide containing indium, gallium, and zinc for the semiconductor layer 108. The semiconductor layer 108 may have a stacked-layer structure in which layers with different compositions, layers with different crystallinities, or layers with different impurity concentrations are stacked.

The conductive layer 112 and the metal oxide layer 114 are processed to have substantially the same top surface shapes.

The metal oxide layer 114 positioned between the insulating layer 110 and the conductive layer 112 functions as a barrier film that prevents diffusion of oxygen contained in the insulating layer 110 into the conductive layer 112 side. Furthermore, the metal oxide layer 114 also functions as a barrier film that prevents diffusion of hydrogen and water contained in the conductive layer 112 into the insulating layer 110 side. For the metal oxide layer 114, a material that is less likely to transmit oxygen and hydrogen than at least the insulating layer 110 can be used, for example.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 into the semiconductor layer 108 through the insulating layer 110 can be prevented. Consequently, the carrier density in a channel formation region of the semiconductor layer 108 can be extremely low.

For the metal oxide layer 114, an insulating material or a conductive material can be used. When having an insulating property, the metal oxide layer 114 functions as part of the gate insulating layer. In contrast, when having conductivity, the metal oxide layer 114 functions as part of the gate electrode.

An insulating material having a higher permittivity than silicon oxide is preferably used for the metal oxide layer 114. It is particularly preferable to use an aluminum oxide film, a hafnium oxide film, a hafnium aluminate film, or the like because drive voltage can be reduced.

For the metal oxide layer 114, a conductive oxide such as indium oxide, indium tin oxide (ITO), or indium tin oxide containing silicon (ITSO) can also be used, for example. A conductive oxide containing indium is particularly preferable because of its high conductivity.

An oxide material containing one or more kinds of elements contained in the semiconductor layer 108 is preferably used for the metal oxide layer 114. In particular, an oxide semiconductor material that can be used for the semiconductor layer 108 is preferably used. At this time, a metal oxide film formed using the same sputtering target as the semiconductor layer 108 is preferably used as the metal oxide layer 114, in which case the same apparatus can be used.

When a metal oxide material containing indium and gallium is used for both the semiconductor layer 108 and the metal oxide layer 114, a material whose composition (content ratio) of gallium is higher than that in the semiconductor layer 108 is preferably used because an oxygen blocking property can be further increased. Here, when a material whose composition of indium is higher than that in the metal oxide layer 114 is used for the semiconductor layer 108, the field-effect mobility of the transistor 100 can be increased.

The metal oxide layer 114 is preferably formed using a sputtering apparatus. For example, in the case where an oxide film is formed using a sputtering apparatus, forming the oxide film in an atmosphere containing an oxygen gas can suitably supply oxygen to the insulating layer 110 or the semiconductor layer 108.

The semiconductor layer 108 includes a region overlapping with the conductive layer 112 and a pair of low-resistance regions 108n between which the region is sandwiched. A region of the semiconductor layer 108 that overlaps with the conductive layer 112 functions as a channel formation region of the transistor 100. Meanwhile, the regions 108n function as a source region and a drain region of the transistor 100.

The region 108n can also be regarded as a region having a lower resistance than the channel formation region, a region having a higher carrier concentration than the channel formation region, a region having a higher oxygen defect density than the channel formation region, a region having a higher impurity concentration than the channel formation region, or an n-type region.

The region 108n of the semiconductor layer 108 is a region containing an impurity element. Examples of the impurity element include hydrogen, boron, carbon, nitrogen, fluorine, phosphorus, sulfur, arsenic, aluminum, and a rare gas element. Note that typical examples of the rare gas element include helium, neon, argon, krypton, and xenon. In particular, boron or phosphorus is preferably contained. Alternatively, two or more of these elements may be contained.

The insulating layer 110 includes a region in contact with the channel formation region of the semiconductor layer 108, i.e., a region overlapping with the conductive layer 112. The insulating layer 110 further includes a region that is in contact with the low-resistance region 108n of the semiconductor layer 108 and that does not overlap with the conductive layer 112.

For each of the insulating layer 103 and the insulating layer 110 that are in contact with the channel formation region of the semiconductor layer 108, an oxide film is preferably used. For example, an oxide film such as a silicon oxide film, a silicon oxynitride film, or an aluminum oxide film can be used. As a result, oxygen released from the insulating layer 103 and the insulating layer 110 can be supplied to the channel formation region of the semiconductor layer 108 by heat treatment or the like in the manufacturing process of the transistor 100, so that oxygen vacancies in the semiconductor layer 108 can be reduced.

A side surface and the top surface of the conductive layer 112 include a region 112d in contact with the insulating layer 116. The region 112d is preferably not oxidized when the insulating layer 116 is formed. Note that in the drawings, the region 112d is a surface of the conductive layer 112, which is a region where the oxidation of the conductive layer 112 is inhibited. When the insulating layer 116 is formed, the region 112d is subjected to plasma treatment using a mixed gas of an oxygen-containing gas and a gas having a reducing property, which will be described in detail in FIG. 6. The plasma treatment allows inhibiting oxidation of the region 112d and deterioration of the electrical characteristics and reliably of the transistor.

For example, a low-resistance conductive material mainly containing any one of copper, silver, gold, and aluminum is preferably used for the conductive layer 112. As an example, a conductive material mainly containing copper has high electric conductivity and high ductility, and thus is a wiring material suitable particularly for a semiconductor device for which flexibility is required (e.g., a display device).

The insulating layer 116 functions as a protective layer that protects the transistor 100. In addition, the insulating layer 116 preferably has a function of preventing diffusion of oxygen, which might be released from the insulating layer 110, to the outside. For example, an inorganic insulating material such as an oxide or a nitride can be used. More specifically, an inorganic insulating material such as silicon nitride, silicon nitride oxide, silicon oxynitride, aluminum oxide, aluminum oxynitride, aluminum nitride, hafnium oxide, or hafnium aluminate can be used, for example.

The insulating layer 110 includes a region 110d that contains the aforementioned impurity element. The region 110d is positioned at least in the vicinity of an interface with the region 108n. The region 110d is also positioned at least in the vicinity of an interface with the insulating layer 103 in a region where the semiconductor layer 108 is not provided and in a region that does not overlap with the conductive layer 112. Furthermore, it is preferable that the region 110d not be provided in a portion that is in contact with the channel formation region of the semiconductor layer 108, as shown in FIGS. 1(B) and 1(C).

The insulating layer 103 includes a region 103d containing the aforementioned impurity element in the vicinity of an interface in contact with the insulating layer 110. The region 103d may also be provided in the vicinity of an interface in contact with the region 108n. In that case, a portion overlapping with the region 108n has a lower impurity concentration than a portion in contact with the insulating layer 110.

Here, the region 108n preferably has a concentration gradient such that the impurity concentration is higher in a portion closer to the insulating layer 110. In that case, an upper portion of the region 108n has lower resistance, and thus contact resistance with the conductive layer 120a (or the conductive layer 120b) can be more effectively reduced. In addition, the total amount of the impurity element in the region 108n can be smaller than that in the case where the concentration is uniform throughout the entire region 108n; thus, the amount of the impurity that might be diffused into the channel formation region owing to the influence of heat applied during the manufacturing process, or the like can be kept small.

Furthermore, the region 110d preferably has a concentration gradient such that the impurity concentration is higher in a portion closer to the semiconductor layer 108. In the insulating layer 110 using an oxide film from which oxygen can be released by heating, release of oxygen in the region 110d to which the impurity element is added can be reduced as compared to that in the other regions. Thus, the region 110d that is positioned in the vicinity of the interface between the insulating layer 110 and the region 108n functions as a blocking layer against oxygen, so that oxygen supplied to the region 108n can be effectively reduced.

As described later, treatment for adding the impurity element to the region 108n and the region 110d can be performed using the conductive layer 112 as a mask. Accordingly, the region 110d can be formed in a self-aligned manner at the same time as the formation of the region 108n.

Note that in FIGS. 1(B), 1(C), and the like, to show that a high-impurity-concentration portion of the insulating layer 110 is positioned in the vicinity of the interface with the semiconductor layer 108 in an exaggerated way, the region 110d is illustrated with a hatch pattern only in the vicinity of the semiconductor layer 108 in the insulating layer 110; in fact, the impurity element is contained in the entire insulating layer 110 in the thickness direction.

The region 108n and the region 110d each preferably include a region whose impurity concentration is higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, further preferably higher than or equal to $1\times10^{20}$ atoms/cm$^3$ and lower than or equal to $1\times10^{22}$ atoms/cm$^3$. In addition, the region 108n preferably includes a portion having a higher impurity concentration than the region 110d of the insulating layer 110 because the electrical resistance of the region 108n can be more effectively reduced.

The concentrations of the impurities contained in the region 108n and the region 110d can be analyzed by an analysis method such as secondary ion mass spectrometry (SIMS) or X-ray photoelectron spectroscopy (XPS), for example. In the case of using XPS analysis, it is possible to find out concentration distribution in a depth direction by the combination of XPS analysis and ion sputtering from a front surface side or a rear surface side.

Here, the semiconductor layer 108 and oxygen vacancies that might be formed in the semiconductor layer 108 will be described.

Oxygen vacancies formed in the semiconductor layer 108 adversely affect the transistor characteristics and therefore cause a problem. For example, when an oxygen vacancy is formed in the semiconductor layer 108, the oxygen vacancy might be bonded to hydrogen to serve as a carrier supply source. The carrier supply source generated in the semiconductor layer 108 causes a change in the electrical characteristics, typically, a shift in the threshold voltage, of the transistor 100. Therefore, it is preferable that the amount of oxygen vacancies in the semiconductor layer 108 be as small as possible.

In view of this, one embodiment of the present invention has a structure in which insulating films in the vicinity of the semiconductor layer 108, specifically, the insulating layer 110 positioned above the semiconductor layer 108 and the insulating layer 103 positioned below the semiconductor layer 108 each include an oxide film. When oxygen is moved from the insulating layer 103 and the insulating layer 110 to the semiconductor layer 108 by heat during the manufacturing process or the like, the amount of oxygen vacancies in the semiconductor layer 108 can be reduced.

In addition, the semiconductor layer 108 preferably includes a region where the atomic proportion of In is higher than the atomic proportion of M. A higher atomic proportion of In results in higher field-effect mobility of the transistor.

Here, in the case of a metal oxide containing In, Ga, and Zn, bonding strength between In and oxygen is weaker than bonding strength between Ga and oxygen; thus, with a higher atomic proportion of In, oxygen vacancies are likely to be generated in the metal oxide film. There is a similar tendency even when a metal element shown above as M is used instead of Ga. The existence of a large amount of oxygen vacancies in the metal oxide film leads to a reduction in electrical characteristics and a reduction in reliability of the transistor.

However, in one embodiment of the present invention, an extremely large amount of oxygen can be supplied to the semiconductor layer 108 containing a metal oxide; thus, a metal oxide material with a high atomic proportion of In can be used. Accordingly, it is possible to achieve a transistor with extremely high field-effect mobility, stable electrical characteristics, and high reliability.

For example, a metal oxide in which the atomic proportion of In is 1.5 times or higher, 2 times or higher, 3 times or higher, 3.5 times or higher, or 4 times or higher the atomic proportion of M can be suitably used.

It is particularly preferable that the atomic ratio of In, M, and Zn in the semiconductor layer 108 be In:M:Zn=5:1:6 or in the neighborhood thereof (M be greater than or equal to 0.5 and less than or equal to 1.5 and Zn be greater than or equal to 5 and less than or equal to 7 when In is 5). Alternatively, the atomic ratio of In, M, and Zn is preferably In:M:Zn=4:2:3 or in the neighborhood thereof. Furthermore, as the composition of the semiconductor layer 108, the atomic proportions of In, M, and Zn in the semiconductor layer 108 may be approximately equal to each other. That is, a material in which the atomic ratio of In, M, and Zn is In:M:Zn=1:1:1 or in the neighborhood thereof may be included.

For example, with the use of the transistor with high field-effect mobility in a gate driver that generates a gate signal, a display device with a small frame width (also referred to as a narrow frame) can be provided. Furthermore, with the use of the transistor with high field-effect mobility in a source driver (particularly a demultiplexer connected to an output terminal of a shift register included in the source driver), a display device to which fewer wirings are connected can be provided.

Note that even when the semiconductor layer 108 includes the region where the atomic proportion of In is higher than the atomic proportion of M, the field-effect mobility might be low if the semiconductor layer 108 has high crystallinity. The crystallinity of the semiconductor layer 108 can be analyzed by using X-ray diffraction (XRD) or a transmission electron microscope (TEM), for example.

Here, impurities such as hydrogen or moisture entering the semiconductor layer 108 adversely affect the transistor characteristics and therefore cause a problem. Thus, it is preferable that the amount of impurities such as hydrogen or moisture in the semiconductor layer 108 be as small as possible. It is preferable to use a metal oxide film in which the impurity concentration is low and the density of defect states is low because a transistor having excellent electrical characteristics can be manufactured. By reducing the impurity concentration and the density of defect states (reducing oxygen vacancies), the carrier density in the film can be reduced. A transistor using such a metal oxide film for a semiconductor layer rarely has electrical characteristics with a negative threshold voltage (also referred to as normally-on). Furthermore, a transistor using such a metal oxide film can have characteristics of an extremely low off-state current.

The semiconductor layer 108 may have a stacked-layer structure of two or more layers.

For example, the semiconductor layer 108 in which two or more metal oxide films with different compositions are stacked can be used. For instance, in the case of using an In-M-Zn oxide, it is preferable to use a stack of two or more films each formed using a sputtering target with an atomic ratio of In:M:Zn=5:1:6, In:M:Zn=4:2:3, In:M:Zn=1:1:1, In:M:Zn=2:2:1, In:M:Zn=1:3:4, or In:M:Zn=1:3:2 or in the neighborhood thereof.

The semiconductor layer 108 in which two or more metal oxide films with different crystallinities are stacked can be used. In that case, the metal oxide films are preferably successively formed without exposure to the air using the same oxide target under different film formation conditions.

For example, the oxygen flow rate ratio at the time of forming an earlier-formed first metal oxide film is set lower than that at the time of depositing a subsequently formed second metal oxide film. Alternatively, the first metal oxide film is formed under the condition without oxygen flowing. In such a manner, oxygen can be effectively supplied at the time of forming the second metal oxide film. The first metal oxide film can have lower crystallinity and higher electrical conductivity than the second metal oxide film. Meanwhile, when the second metal oxide film provided in an upper portion has higher crystallinity than the first metal oxide film, damage caused at the time of processing the semiconductor layer 108 or forming the insulating layer 110 can be inhibited.

More specifically, the oxygen flow rate ratio at the time of forming the first metal oxide film is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of forming the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. The conditions at the time of the film formation, such as pressure, temperature, and power may vary between the first metal oxide film and the second metal oxide film; however, it is preferable to employ the same conditions except for the oxygen flow rate ratio because the time required for film formation steps can be shortened.

With such a structure, the transistor 100 with excellent electrical characteristics and high reliability can be achieved.

The above is the description of Structure example 1.

Structure Example 2

A transistor structure example that is partly different from above Structure example 1 will be described below.

Note that description of the same portions as those in above Structure example 1 will be omitted below in some cases. Furthermore, in drawings that are referred to later, the same hatching pattern is applied to portions having functions similar to those in above Structure example 1, and the portions are not denoted by reference numerals in some cases.

Figure 2B:
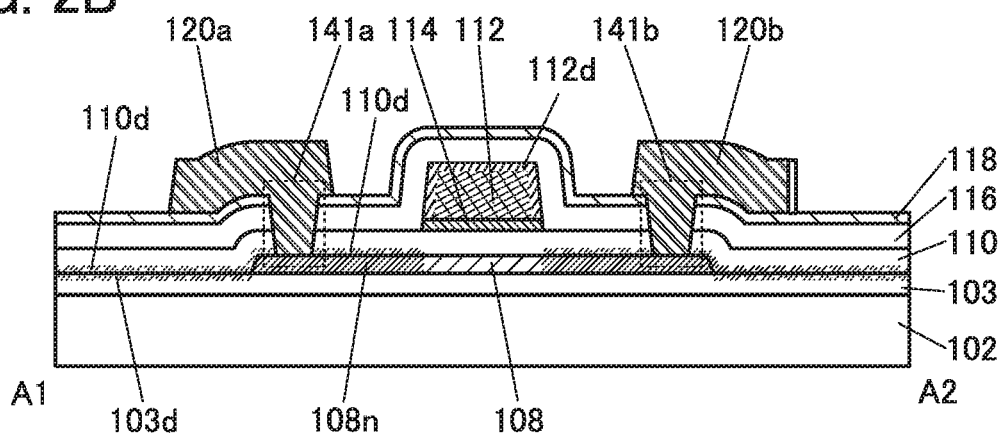
Figure 2C:
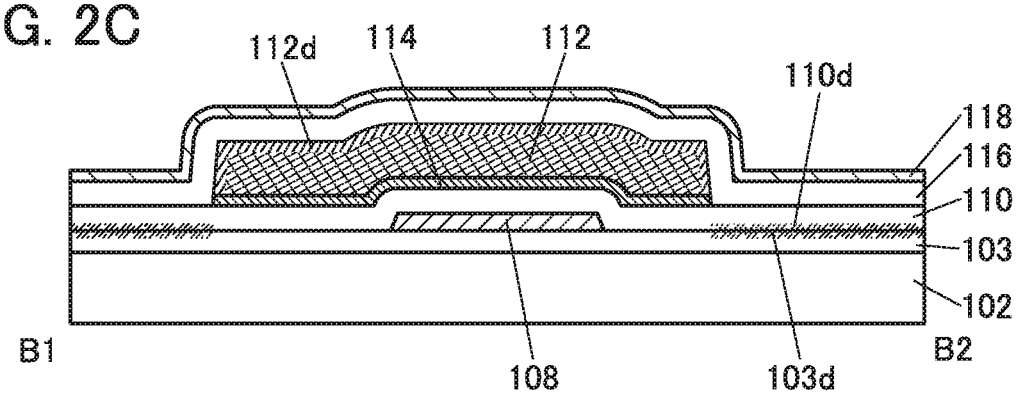

FIG. 2(A) is a top view of the transistor 100, FIG. 2(B) is a cross-sectional view of the transistor 100 in the channel length direction, and FIG. 2(C) is a cross-sectional view of the transistor 100 in the channel width direction.

FIG. 2 is different from FIG. 1 in that an insulating layer 118 is provided to cover the top surface of the insulating layer 116.

The insulating layer 118 functions as a protective layer that protects the transistor 100. In addition, the insulating layer 118 preferably has a function of preventing diffusion of oxygen, which might be released from the insulating layer 110, to the outside. For example, an inorganic insulating material such as an oxide or a nitride can be used. More specifically, an inorganic insulating material such as silicon nitride, silicon nitride oxide, silicon oxynitride, aluminum oxide, aluminum oxynitride, aluminum nitride, hafnium oxide, or hafnium aluminate can be used, for example.

Note that the case where the insulating layer 116 and the insulating layer 118 are stacked as the protective layer is described here; either the insulating layer 116 or the insulating layer 118 may include a plurality of layers. For example, the insulating layer 116 may include two or more oxide layers with different compositions. It is preferable that an insulating layer 116a in contact with the insulating layer 110 contain a larger amount of oxygen than an insulating layer 116b and the insulating layer 116b contain a larger amount of nitrogen than the insulating layer 116a. Such a stacked-layer structure enables the insulating layer 116a to supply a large amount of oxygen to the insulating layer 110 and the insulating layer 116b to inhibit diffusion of impurities such as hydrogen from the outside.

Structure Example 3

A transistor structure example that is partly different from Structure example 2 shown above will be described below.

Note that description of the same portions as those in Structure example 2 shown above will be omitted below in some cases. Furthermore, in drawings that are referred to later, the same hatching pattern is applied to portions having functions similar to those in above Structure example 2, and the portions are not denoted by reference numerals in some cases.

Figure 3A:
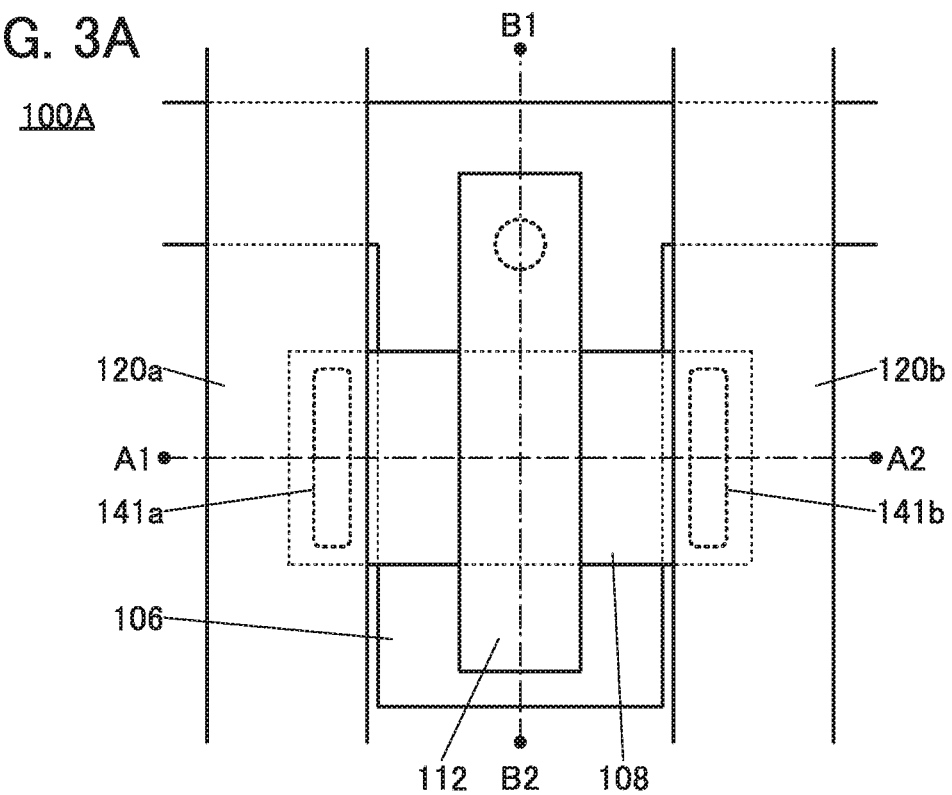
FIGS. 3 (A), (B), and (C) are structure examples of a transistor.
Figure 3B:
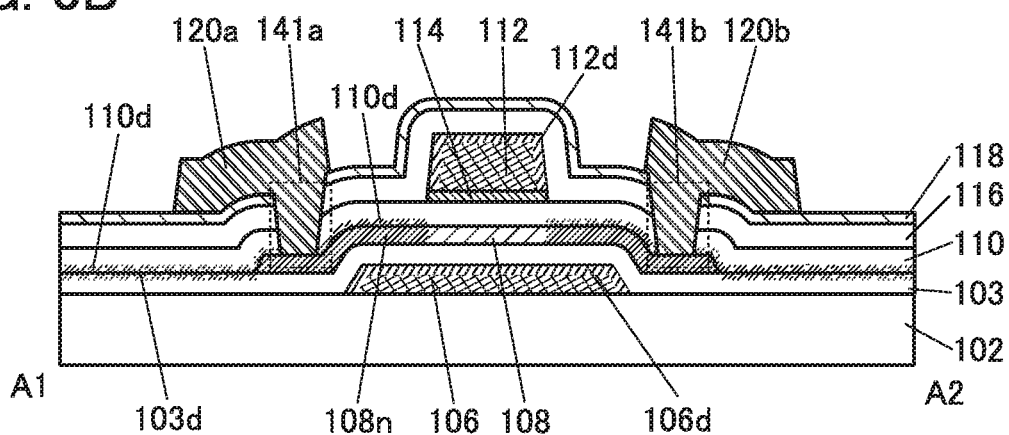
Figure 3C:
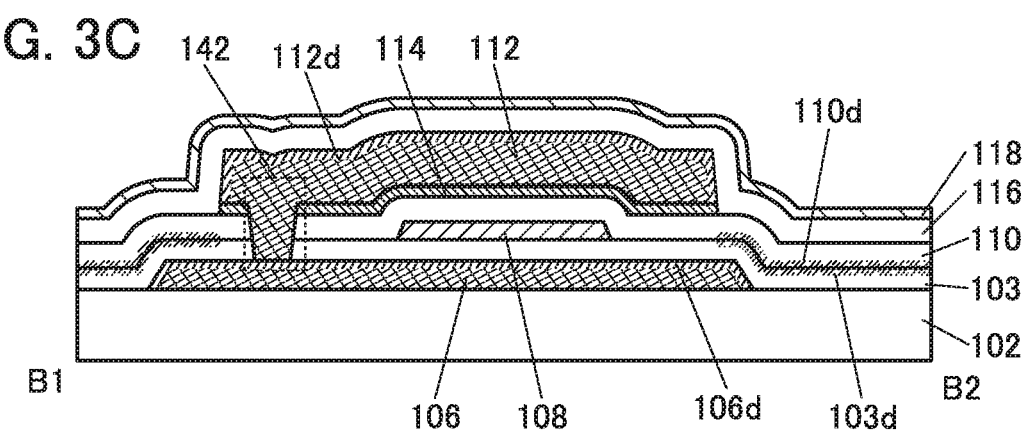

FIG. 3(A) is a top view of a transistor 100A, FIG. 3(B) is a cross-sectional view of the transistor 100A in the channel length direction, and FIG. 3(C) is a cross-sectional view of the transistor 100A in the channel width direction.

The transistor 100A is different from Structure example 2 mainly in including a conductive layer 106 between the substrate 102 and the insulating layer 103. The conductive layer 106 includes a region overlapping with the semiconductor layer 108 and the conductive layer 112.

In the transistor 100A, the conductive layer 106 has a function of a first gate electrode (also referred to as a bottom gate electrode), and the conductive layer 112 has a function of a second gate electrode (also referred to as a top gate electrode). In addition, part of the insulating layer 103 functions as a first gate insulating layer, and part of the insulating layer 110 functions as a second gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 will be sometimes referred to as a channel formation region in the following description; in fact, a channel can also be formed in a portion not overlapping with the conductive layer 112 and overlapping with the conductive layer 106 (a portion including the region 108n).

As shown in FIG. 3(C), the conductive layer 106 may be electrically connected to the conductive layer 112 through an opening portion 142 provided in the metal oxide layer 114, the insulating layer 110, and the insulating layer 103. In that case, the same potential can be supplied to the conductive layer 106 and the conductive layer 112.

For the conductive layer 106, a material similar to that for the conductive layer 112, the conductive layer 120a, or the conductive layer 120b can be used. In particular, a material containing copper is preferably used for the conductive layer 106 because wiring resistance can be reduced. The conductive layer 106 includes a region 106d. When the insulating layer 103 is formed to cover the conductive layer 106, the region 106d is subjected to plasma treatment using a mixed gas of an oxygen-containing gas and a gas having a reducing property. The plasma treatment allows inhibiting oxidation of the region 112d and deterioration of the electrical characteristics and reliably of the transistor. Note that the plasma treatment performed on the region 106d is a step similar to that of the plasma treatment performed on the region 112d of the conductive layer 112, and thus, is not described in detail.

As shown in FIGS. 3(A) and 3(C), the conductive layer 112 and the conductive layer 106 preferably extend beyond an end portion of the semiconductor layer 108 in the channel width direction. In that case, as illustrated in FIG. 3(C), the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by a pair of gate electrodes. At this time, it is particularly preferable that the same potential be supplied to the conductive layer 106 and the conductive layer 112. In that case, electric fields for inducing a channel can be effectively applied to the semiconductor layer 108, increasing the on-state current of the transistor 100A. Thus, the transistor 100A can also be miniaturized.

Note that a structure in which the conductive layer 112 and the conductive layer 106 are not connected to each other may be employed. In that case, a constant potential may be supplied to one of the pair of gate electrodes, and a signal for driving the transistor 100A may be supplied to the other of the pair of gate electrodes. In this case, the potential supplied to one of the electrodes can control the threshold voltage at the time of driving the transistor 100A with the other electrode.

The above is the description of Structure example 3.

Application Example

Examples where a semiconductor film containing an impurity is used as one electrode of a capacitor and a transistor and the capacitor are formed on the same plane will be described below.

Figure 4A:
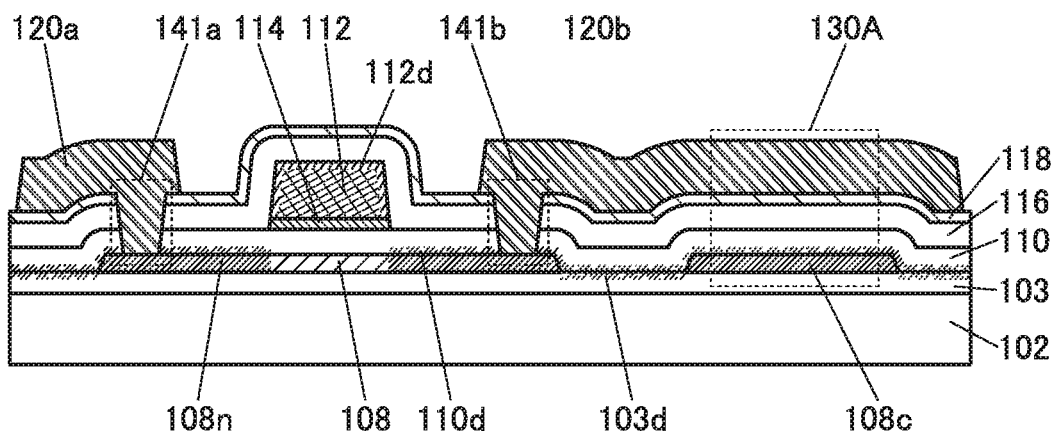
FIGS. 4 (A), (B), and (C) are structure examples of a transistor.

In a cross-sectional view of FIG. 4(A), a capacitor 130A is provided next to the transistor 100 illustrated in Structure example 2.

Figure 4B:
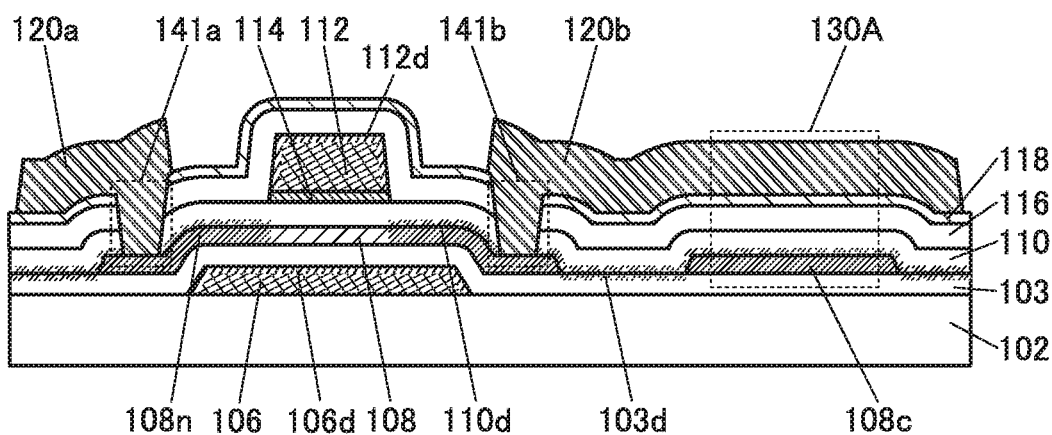

In a cross-sectional view of FIG. 4(B), the capacitor 130A is provided next to the transistor 100A illustrated in Structure example 3.

The capacitor 130A has a structure in which the insulating layer 110, the insulating layer 116, and the insulating layer 118 that serve as a dielectric are provided between a semiconductor layer 108c and the conductive layer 120b.

The semiconductor layer 108c is provided on the same plane as the semiconductor layer 108. For example, the semiconductor layer 108c can be formed in such a manner that the metal oxide film to be the semiconductor layer 108 is processed and then, an impurity element that is added to the region 108n is added.

With such a structure, the capacitor 130A can be manufactured without an increase in the number of steps.

Figure 4C:
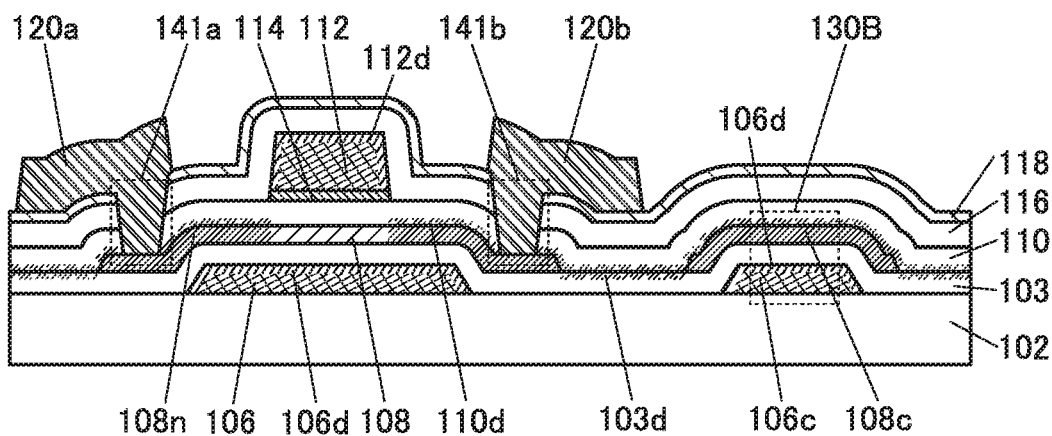

A capacitor 130B shown in FIG. 4(C) has a structure in which the insulating layer 103 serving as a dielectric is provided between a conductive layer 106c and the semiconductor layer 108c.

The conductive layer 106c is provided on the same plane as the conductive layer 106. The conductive layer 106c can be formed by processing the conductive film to be the conductive layer 106.

The capacitor 130B can have a thinner dielectric than the capacitor 130A and thus can have higher capacitance.

The above is the description of Application example.

[Components of Semiconductor Device]

Next, components of the semiconductor device in this embodiment will be described in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate using silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the transistor 100 and the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In that case, the transistor 100 and the like can be transferred onto a substrate having low heat resistance or a flexible substrate as well.

[Insulating Layer 103]

The insulating layer 103 can be formed by a sputtering method, a CVD method, an evaporation method, a pulsed laser deposition (PLD) method, or the like as appropriate. As the insulating layer 103, for example, a single layer or a stacked layer of an oxide insulating film or a nitride insulating film can be formed. Note that to improve the properties of the interface with the semiconductor layer 108, at least a region in the insulating layer 103 that is in contact with the semiconductor layer 108 is preferably formed using an oxide insulating film. Furthermore, a film from which oxygen is released by heating is preferably used for the insulating layer 103.

For example, a single layer or a stacked layer using silicon oxide, silicon oxynitride, silicon nitride oxide, silicon nitride, aluminum oxide, hafnium oxide, gallium oxide, Ga—Zn oxide, or the like can be provided as the insulating layer 103.

In the case where a film other than an oxide film, such as a silicon nitride film, is used for the side of the insulating layer 103 that is in contact with the semiconductor layer 108, pretreatment such as oxygen plasma treatment is preferably performed on a surface in contact with the semiconductor layer 108 to oxidize the surface or the vicinity of the surface.

[Conductive Film]

The conductive layer 112 and the conductive layer 106 functioning as the gate electrodes, the conductive layer 120a functioning as the source electrode, and the conductive layer 120b functioning as the drain electrode can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

For the conductive layer 112, the conductive layer 106, the conductive layer 120a, and the conductive layer 120b, an oxide conductor or a metal oxide film such as In—Sn oxide, In—W oxide, In—W—Zn oxide, In—Ti oxide, In—Ti—Sn oxide, In—Zn oxide, In—Sn—Si oxide, or In—Ga—Zn oxide can also be used.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

The conductive layer 112 and the like may each have a stacked-layer structure of a conductive film containing the above-described oxide conductor (metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

Among the above metal elements, any one or more metal elements selected from titanium, tungsten, tantalum, and molybdenum are particularly preferably included in the conductive layer 112, the conductive layer 106, the conductive layer 120a, and the conductive layer 120b. In particular, a tantalum nitride film is preferably used. Since the tantalum nitride film has conductivity and a high barrier property against copper, oxygen, or hydrogen and releases little hydrogen from itself, it can be favorably used as the conductive film in contact with the semiconductor layer 108 or the conductive film in the vicinity of the semiconductor layer 108.

[Insulating Layer 110]

The insulating layer 110 functioning as a gate insulating film of the transistor 100 or the like can be formed by a PECVD method, a sputtering method, or the like. For the insulating layer 110, an insulating layer containing one or more kinds of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the insulating layer 110 may have a stacked-layer structure of two or more layers.

The insulating layer 110 in contact with the semiconductor layer 108 is preferably an oxide insulating film and further preferably includes a region containing oxygen in excess of that in the stoichiometric composition. In other words, the insulating layer 110 is an insulating film capable of releasing oxygen. It is also possible to supply oxygen to the insulating layer 110 by forming the insulating layer 110 in an oxygen atmosphere, performing heat treatment, plasma treatment, or the like on the formed insulating layer 110 in an oxygen atmosphere, or forming an oxide film over the insulating layer 110 in an oxygen atmosphere, for example.

For the insulating layer 110, a material having a higher relative permittivity than silicon oxide or silicon oxynitride, such as hafnium oxide, can also be used. In that case, the insulating layer 110 can be thick and leakage current due to tunnel current can be inhibited. In particular, hafnium oxide having crystallinity is preferable because it has a higher relative permittivity than amorphous hafnium oxide.

[Semiconductor Layer]

In the case where the semiconductor layer 108 is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, which facilitates formation of the semiconductor layer 108 having crystallinity. Note that the atomic ratio in the semiconductor layer 108 to be formed may vary in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the formed semiconductor layer 108 is sometimes in the neighborhood of In:Ga:Zn=4:2:3 [atomic ratio].

Note that when the atomic ratio is described as In:Ga:Zn=4:2:3 or in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The energy gap of the semiconductor layer 108 is 2 eV or more, preferably 2.5 eV or more. With the use of such a metal oxide having a wider energy gap than silicon, the off-state current of the transistor can be reduced.

The semiconductor layer 108 preferably has a non-single-crystal structure. The non-single-crystal structure includes, for example, a CAAC structure which will be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. On the other hand, a clear grain boundary cannot be observed in the CAAC-OS; thus, it can be said that a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an InGaZnO$_4$ crystal having a YbFe$_2$O$_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

An example of a crystal structure of a metal oxide is described. Note that a metal oxide deposited by a sputtering method using an In—Ga—Zn oxide target (In:Ga:Zn=4:2: 4.1 [atomic ratio]) is described below as an example. A metal oxide that is formed by a sputtering method using the above target at a substrate temperature higher than or equal to 100° C. and lower than or equal to 130° C. is likely to have either the nc (nano crystal) structure or the CAAC structure, or a structure in which both structures are mixed. By contrast, a metal oxide formed by a sputtering method at a substrate temperature set at room temperature (R.T.) is likely to have the nc structure. Note that room temperature (R.T.) here also includes a temperature in the case where a substrate is not heated intentionally.

Manufacturing Method Example

A manufacturing method example of a transistor in one embodiment of the present invention will be described below. Here, description will be made giving, as an example, the transistor 100 illustrated in Structure example 2.

Note that thin films (insulating films, semiconductor films, conductive films, and the like) that constitute the semiconductor device can be formed by a sputtering method, a chemical vapor deposition (CVD) method, a vacuum evaporation method, a pulse laser deposition (PLD) method, an atomic layer deposition (ALD) method, or the like. Examples of the CVD method include a plasma-enhanced chemical vapor deposition (PECVD) method and a thermal CVD method. An example of the thermal CVD method include a metal organic chemical vapor deposition (MOCVD) method.

Alternatively, the thin films (the insulating films, the semiconductor films, the conductive films, and the like) that constitute the semiconductor device can be formed by a method such as spin coating, dipping, spray coating, or droplet discharging (ink-jetting, dispensing, screen printing, offset printing), or with a tool (equipment) such as a doctor knife, a slit coater, a roll coater, a curtain coater, or a knife coater.

When the thin films that constitute the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a film formation method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, and the thin film is processed into a desired shape.

For light for exposure in a photolithography method, an i-line (with a wavelength of 365 nm), a g-line (with a wavelength of 436 nm), an h-line (with a wavelength of 405 nm), or combined light of any of them can be used, for example. Besides, ultraviolet light, KrF laser light, ArF laser light, or the like can be used. Exposure may be performed by liquid immersion light exposure technique. As the light used for the exposure, extreme ultra-violet (EUV) light or X-rays may be used. Instead of the light used for the exposure, an electron beam can also be used. It is preferable to use extreme ultra-violet light, X-rays, or an electron beam because extremely minute processing can be performed. Note that in the case where exposure is performed by scanning of a beam such as an electron beam, a photomask is not needed.

For etching of the thin film, a dry etching method, a wet etching method, a sandblast method, or the like can be used.

In each of the drawings shown in FIG. 5 and FIG. 6, cross sections of the transistor 100A in the channel length direction and the channel width direction in each step of the manufacturing process are shown side by side.

[Formation of Conductive Layer 106]

A conductive film is formed over the substrate 102 and processed by etching, whereby the conductive layer 106 functioning as a gate electrode is formed.

[Plasma Treatment on Conductive Layer 106]

Figure 5A:
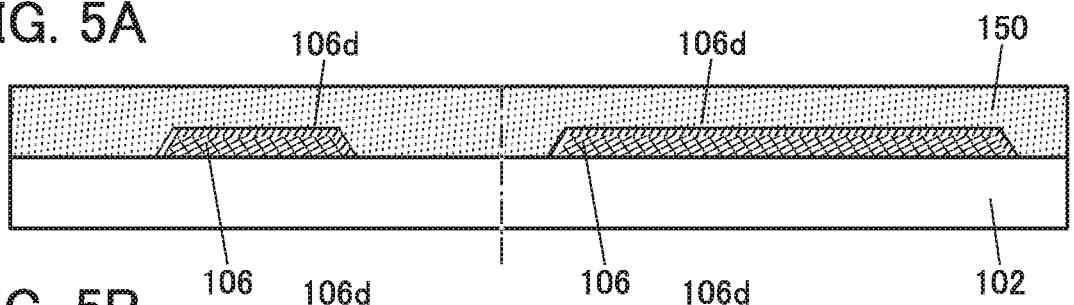
FIGS. 5 (A), (B), (C), (D), and (E) are diagrams showing a method for manufacturing a transistor.

Then, before the insulating layer 103 is formed, the region 106d is subjected to plasma treatment 150 using a mixed gas of an oxygen-containing gas and a gas having a reducing property (FIG. 5(A)). The plasma treatment on the region 106d allows inhibiting oxidation of the region 106d in the subsequent step of forming the insulating layer 103. This plasma treatment is the same as that performed on the conductive layer 112. The later section "Plasma treatment on conductive layer 112" can be referred to for a detailed description of this plasma treatment.

[Formation of Insulating Layer 103]

Then, the insulating layer 103 is formed to cover the substrate 102 and the conductive layer 106. The insulating layer 103 can be formed by a PECVD method, an ALD method, a sputtering method, or the like. Note that the insulating layer 103 is preferably formed in the treatment chamber where the plasma treatment 150 is performed. Furthermore, the treatment for forming the insulating layer 103 is preferably performed at the same temperature as the plasma treatment.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method.

[Formation of Semiconductor Layer 108]

Figure 5B:
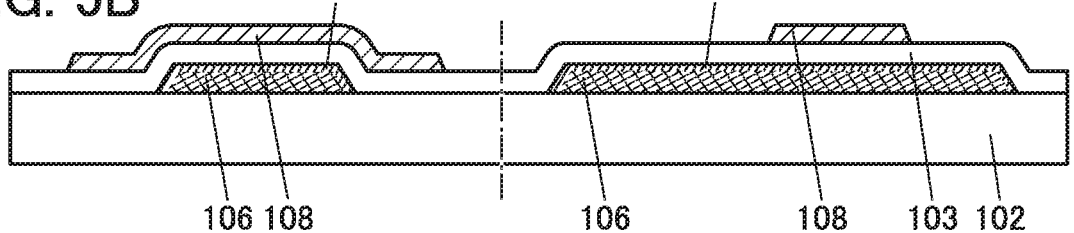

Next, a metal oxide film is formed over the insulating layer 103 and processed to form the island-shaped semiconductor layer 108 (FIG. 5(B)).

The metal oxide film is preferably formed by a sputtering method using a metal oxide target.

In forming the metal oxide film, an inert gas (such as a helium gas, an argon gas, or a xenon gas) may be mixed in addition to an oxygen gas. Note that the metal oxide film can have higher crystallinity when formed with a higher proportion of the oxygen gas in the whole film formation gas (hereinafter also referred to as an oxygen flow rate ratio), so that a transistor with high reliability can be achieved. In contrast, the metal oxide film has lower crystallinity with a lower oxygen flow rate ratio, so that a transistor with a high on-state current can be obtained.

As formation conditions of the metal oxide film, the substrate temperature is higher than or equal to room temperature and lower than or equal to 200° C., preferably higher than or equal to room temperature and lower than or equal to 140° C. For example, the substrate temperature in film formation is preferably higher than or equal to room temperature and lower than 140° C., in which case high productivity is achieved. Furthermore, when the metal oxide film is formed with the substrate temperature set at room temperature or without intentional heating, the crystallinity can be made low.

Before the metal oxide film is formed, it is preferable to perform treatment for desorbing water, hydrogen, an organic substance, or the like adsorbed onto a surface of the insulating layer 103 or treatment for supplying oxygen to the insulating layer 103. For example, heat treatment can be performed at a temperature higher than or equal to 70° C. and lower than or equal to 200° C. in a reduced-pressure atmosphere. Alternatively, plasma treatment may be performed in an oxygen-containing atmosphere. In addition, when plasma treatment is performed in an atmosphere containing a nitric oxide gas, an organic substance on the surface of the insulating layer 103 can be suitably removed. After such treatment, the metal oxide film is preferably formed successively without exposure of the surface of the insulating layer 103 to the air.

For processing of the metal oxide film, either one or both a wet etching method and a dry etching method is used. At this time, part of the insulating layer 103 that does not overlap with the semiconductor layer 108 is etched and thinned in some cases.

After the metal oxide film is formed or processed into the semiconductor layer 108, heat treatment may be performed to remove hydrogen or water in the metal oxide film or the semiconductor layer 108. The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an atmosphere containing a rare gas or nitrogen. Alternatively, after the heating in the atmosphere, heating may be performed in an oxygen-containing atmosphere. Note that it is preferable that the atmosphere of the heat treatment not contain hydrogen, water, or the like. An electric furnace, an RTA apparatus, or the like can be used for the heat treatment. The use of an RTA apparatus can shorten the heat treatment time.

[Formation of Insulating Layer 110 and Metal Oxide Film 114f]

Figure 5C:
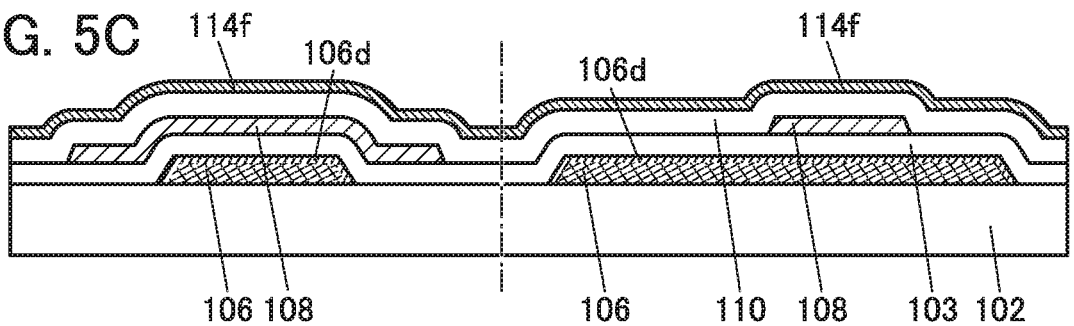

Next, a stack of the insulating layer 110 and a metal oxide film 114f is formed to cover the insulating layer 103 and the semiconductor layer 108 (FIG. 5(C)).

As the insulating layer 110, for example, an oxide film such as a silicon oxide film or a silicon oxynitride film is preferably formed with a plasma-enhanced chemical vapor deposition apparatus (a PECVD apparatus or simply referred to as a plasma CVD apparatus). Alternatively, the insulating layer 110 may be formed by a PECVD method using a microwave.

The metal oxide film 114f is preferably formed in an oxygen-containing atmosphere, for example. In particular, the metal oxide film 114f is preferably formed by a sputtering method in an oxygen-containing atmosphere. In that case, oxygen can be supplied to the insulating layer 110 at the time of forming the metal oxide film 114f.

The above description can be referred to for the case where the metal oxide film 114f is formed by a sputtering method using an oxide target containing a metal oxide as in the case of forming the semiconductor layer 108.

For example, as formation conditions of the metal oxide film 114f, a metal oxide film may be formed by a reactive sputtering method using a metal target and oxygen as a film formation gas. When aluminum is used for the metal target, for example, an aluminum oxide film can be formed.

At the time of forming the metal oxide film 114f, a larger amount of oxygen can be supplied to the insulating layer 110 with a higher proportion of the oxygen flow rate to the total flow rate of the film formation gas introduced into a deposition chamber of a deposition apparatus (i.e., with a higher oxygen flow rate ratio), or with a higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, and still further preferably higher than or equal to 90% and lower than or equal to 100%. It is particularly preferred that the oxygen flow rate ratio be 100% and the oxygen partial pressure be as close to 100% as possible.

When the metal oxide film 114f is thus formed by a sputtering method in an oxygen-containing atmosphere, oxygen can be supplied to the insulating layer 110 and release of oxygen from the insulating layer 110 can be prevented during the formation of the metal oxide film 114f. As a result, an extremely large amount of oxygen can be enclosed in the insulating layer 110. Moreover, a large amount of oxygen can be supplied to the semiconductor layer 108 by heat treatment performed later. As a result, the amount of oxygen vacancies in the semiconductor layer 108 can be reduced, leading to a highly reliable transistor.

In addition, oxygen may be supplied from the insulating layer 110 to the semiconductor layer 108 by heat treatment performed after the formation of the metal oxide film 114f. The heat treatment can be performed at a temperature higher than or equal to 200° C. and lower than or equal to 400° C. in an atmosphere containing one or more of nitrogen, oxygen, and a rare gas.

Then, after the formation of the metal oxide film 114f, the metal oxide film 114f, the insulating layer 110, and the insulating layer 103 are partly etched to form an opening reaching the conductive layer 106. Accordingly, the conductive layer 112 to be formed later can be electrically connected to the conductive layer 106 through the opening.

[Formation of Conductive Layer 112 and Metal Oxide Layer 114]

Figure 5D:
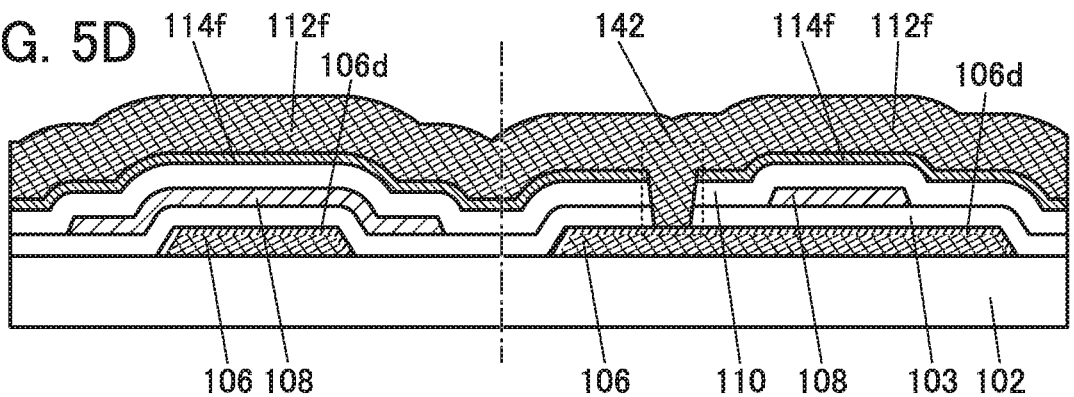

Next, a conductive film 112f to be the conductive layer 112 is formed over the metal oxide film 114f (FIG. 5(D)). The conductive film 112f is preferably formed by a sputtering method using a sputtering target of a metal or an alloy.

Figure 5E:
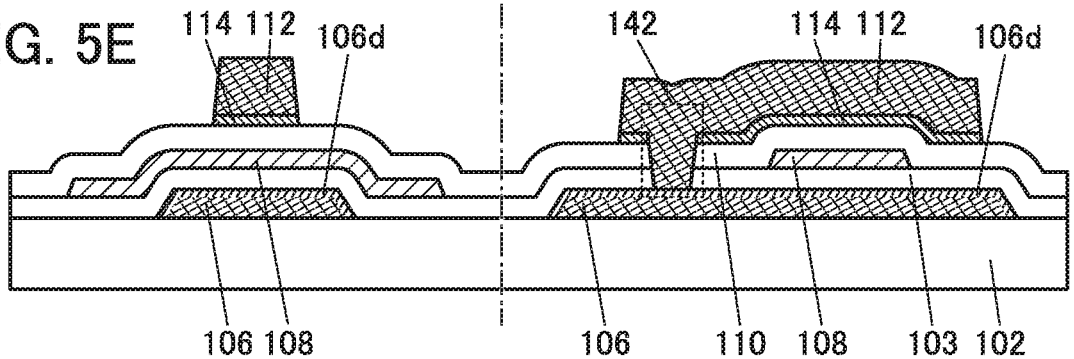

Next, the conductive film 112f and the metal oxide film 114f are partly etched to form the conductive layer 112 and the metal oxide layer 114 (FIG. 5(E)). The conductive film 112f and the metal oxide film 114f are preferably processed using the same resist mask. Alternatively, the metal oxide film 114f may be etched using the conductive layer 112 after etching as a hard mask.

In such a manner, the conductive layer 112 and the metal oxide layer 114 that have substantially the same top surface shapes can be formed.

As shown above, the insulating layer 110 is not etched and covers the top surface and the side surface of the semiconductor layer 108 and the insulating layer 103, which prevents the semiconductor layer 108 and the insulating layer 103 from being partly etched and thinned in etching the conductive layer 112 or the like.

[Treatment for Supplying Impurity Element]

Figure 6A:
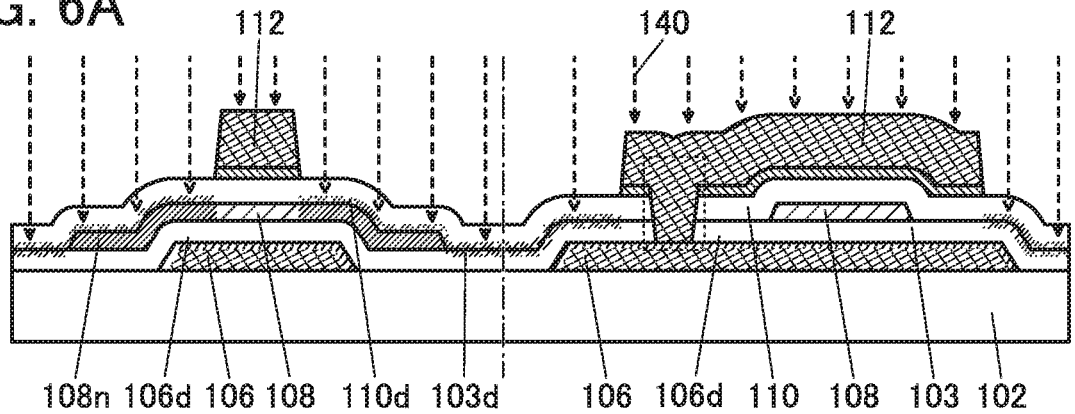
FIGS. 6 (A), (B), (C), and (D) are diagrams showing the method for manufacturing the transistor.

Next, treatment for supplying (or adding or implanting) an impurity element 140 to the insulating layer 110 and the semiconductor layer 108 is performed using the conductive layer 112 as a mask to form the region 108n, the region 110d, and the region 103d (FIG. 6(A)). In the semiconductor layer 108 and the insulating layer 110, regions overlapping with the conductive layer 112 are not supplied with the impurity element 140 owing to the conductive layer 112 serving as the mask.

A plasma ion doping method or an ion implantation method can be suitably used for the supply of the impurity element 140. In these methods, a concentration profile in a depth direction can be controlled with high accuracy by the acceleration voltage, dosage, or the like of ions. The use of a plasma ion doping method can increase productivity. In addition, the use of an ion implantation method with mass separation can increase the purity of an impurity element to be supplied.

In the treatment for supplying the impurity element 140, treatment conditions are preferably controlled such that the concentration is the highest at an interface between the semiconductor layer 108 and the insulating layer 110, a portion in the semiconductor layer 108 near the interface, or a portion in the insulating layer 110 near the interface. Accordingly, the impurity element 140 at an optimal concentration can be supplied to both the semiconductor layer 108 and the insulating layer 110 in one treatment.

Examples of the impurity element 140 include hydrogen, boron, carbon, nitrogen, fluorine, phosphorus, sulfur, arsenic, aluminum, magnesium, silicon, and a rare gas element. Note that typical examples of the rare gas element include helium, neon, argon, krypton, and xenon. It is particularly preferable to use boron, phosphorus, aluminum, magnesium, or silicon.

As a source gas of the impurity element 140, a gas containing the impurity element can be used. In the case where boron is supplied, typically, a $B_2H_6$ gas, a $BF_3$ gas, or the like can be used. In the case where phosphorus is supplied, typically, a $PH_3$ gas can be used. Alternatively, a mixed gas in which any of these source gases are diluted with a rare gas may be used. Alternatively, $CH_4$, $N_2$, $NH_3$, $AlH_3$, $AlCl_3$, $SiH_4$, $Si_2H_6$, $F_2$, $HF$, $H_2$, $(C_5H_5)_2Mg$, a rare gas, or the like can be used as the source gas. An ion source is not limited to a gas, and a solid or a liquid that is vaporized by heating may be used.

Addition of the impurity element 140 can be controlled by setting the conditions such as the acceleration voltage and the dosage in consideration of the compositions, densities, thicknesses, and the like of the insulating layer 110 and the semiconductor layer 108.

For example, in the case where boron is added by an ion implantation method or a plasma ion doping method, the acceleration voltage can be, for example, higher than or equal to 5 kV and lower than or equal to 100 kV, preferably higher than or equal to 7 kV and lower than or equal to 70 kV, further preferably higher than or equal to 10 kV and lower than or equal to 50 kV. The dosage can be, for example, greater than or equal to $1\times10^{13}$ ions/cm² and less than or equal to $1\times10^{17}$ ions/cm², preferably greater than or equal to $1\times10^{14}$ ions/cm² and less than or equal to $5\times10^{16}$ ions/cm², further preferably greater than or equal to $1\times10^{15}$ ions/cm² and less than or equal to $3\times10^{16}$ ions/cm².

In the case where phosphorus ions are added by an ion implantation method or a plasma ion doping method, the acceleration voltage can be, for example, higher than or equal to 10 kV and lower than or equal to 100 kV, preferably higher than or equal to 30 kV and lower than or equal to 90 kV, further preferably higher than or equal to 40 kV and lower than or equal to 80 kV. Furthermore, the dosage can be, for example, greater than or equal to $1\times10^{13}$ ions/cm² and less than or equal to $1\times10^{17}$ ions/cm², preferably greater than or equal to $1\times10^{14}$ ions/cm² and less than or equal to $5\times10^{16}$ ions/cm², further preferably greater than or equal to $1\times10^{15}$ ions/cm² and less than or equal to $3\times10^{16}$ ions/cm².

Note that a method for supplying the impurity element 140 is not limited thereto; plasma treatment, treatment using thermal diffusion by heating, or the like may be used, for example. In a plasma treatment method, plasma is generated in a gas atmosphere containing an impurity element to be added and plasma treatment is performed, so that the impurity element can be added. A dry etching apparatus, an ashing apparatus, a plasma CVD apparatus, a high-density plasma CVD apparatus, or the like can be used as an apparatus for generating the plasma.

In one embodiment of the present invention, the impurity element 140 can be supplied to the semiconductor layer 108 through the insulating layer 110. Thus, even in the case where the semiconductor layer 108 has crystallinity, degradation of crystallinity can be inhibited at the time of supplying the impurity element 140. Therefore, this is suitable for the case where a reduction in crystallinity increases electrical resistance.

[Plasma Treatment on Conductive Layer 112]

Figure 6B:
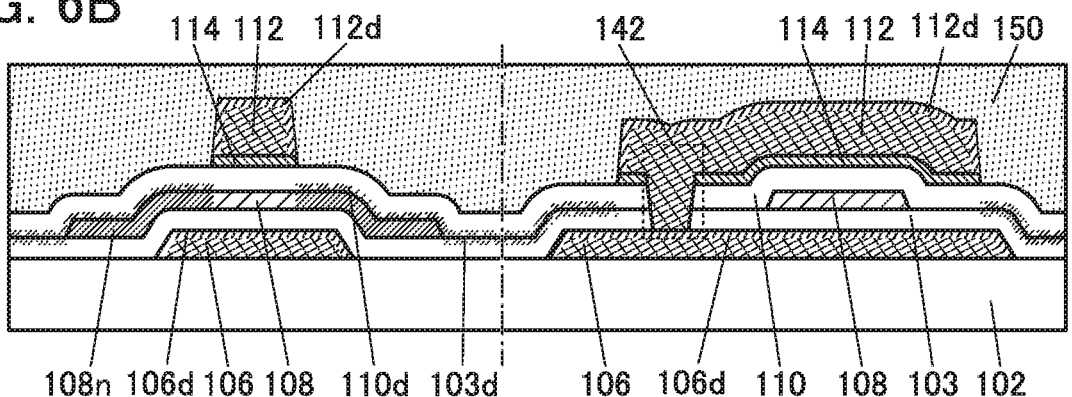

Then, before the insulating layer 110 is formed, the region 112d is subjected to the plasma treatment 150 using a mixed gas of an oxygen-containing gas and a gas having a reducing property (FIG. 6(B)). The plasma treatment on the region 112d allows inhibiting oxidation of the region 112d in the subsequent step of forming the insulating layer 116.

The plasma treatment 150 allows oxygen to be supplied to the insulating layer 110. Thus, oxygen in the insulating layer 110 can be diffused into the semiconductor layer 108 by heat treatment performed later. This can reduce the carrier density in the channel formation region in the semiconductor layer 108. As described above, the region 110d including an impurity element is formed in the insulating layer 110; thus, diffusion of oxygen into the region 108n of the semiconductor layer 108 can be inhibited to selectively supply a large amount of oxygen to the channel formation region.

When the plasma treatment is performed, first, the surface of the conductive layer 112 is subjected to plasma treatment in an atmosphere including a mixed gas of a first gas containing an oxygen element but not containing a hydrogen element and a second gas containing a hydrogen element but not containing an oxygen element. As the first gas, for example, nitrogen oxide such as $N_2O$ (nitrous oxide or dinitrogen monoxide), $NO_2$ (nitrogen dioxide), or NO (nitric oxide), or a gas containing $O_2$ (oxygen), $O_3$ (ozone), or the like is preferably used. As the second gas, for example, a gas containing $NH_3$ (ammonia), $H_2$ (hydrogen), or the like is preferably used. It is particularly preferable to use, as a mixed gas used for the plasma treatment, a mixed gas containing a rare gas such as Ar in addition to $N_2O$ and $NH_3$.

The ratio of the first gas to the second gas in the mixed gas can be controlled by controlling the flow rate of each gas supplied to a treatment chamber for the plasma treatment. Note that the ratio between two kinds of gases in a mixed gas can be expressed in, for example, the volume ratio, the partial pressure ratio, or the weight ratio. Here, the flow rate ratio between the two kinds of gases supplied to the treatment chamber is substantially the same as the volume ratio and the partial pressure ratio between the two kinds of gases.

Here, when the proportion of the second gas is too low (the flow rate is too small), an oxidation reaction becomes predominant over a reduction reaction, and an oxide is generated on the surface of the gate electrode. By contrast, when the proportion of the second gas is too high, an excess hydrogen element in the second gas may diffuse into the channel formation region in the semiconductor layer 108 through the conductive layer 112 to increase the carrier density in the semiconductor layer 108. Thus, the flow rate of the second gas is preferably at least lower than or equal to the flow rate of the first gas. Then, the amount of a hydrogen element supplied to the semiconductor layer 108 can be reduced. This is probably because even in the case where the unreacted excess hydrogen element contained in the second gas exists, the excess hydrogen element reacts with an oxygen element contained in the first gas and is released from the treatment chamber in a state of hydroxide.

As for the flow rate ratio between the first gas and the second gas, when the flow rate of the first gas is 100%, the flow rate of the second gas can be higher than or equal to 0.5% and lower than or equal to 100%, preferably higher than or equal to 1% and lower than or equal to 90%, further preferably higher than or equal to 3% and lower than or equal to 80%, still further preferably higher than or equal to 3% and lower than or equal to 60%, and still further preferably higher than or equal to 3% and lower than or equal to 50%.

[Formation of Insulating Layer 116 and Insulating Layer 118]

Figure 6C:
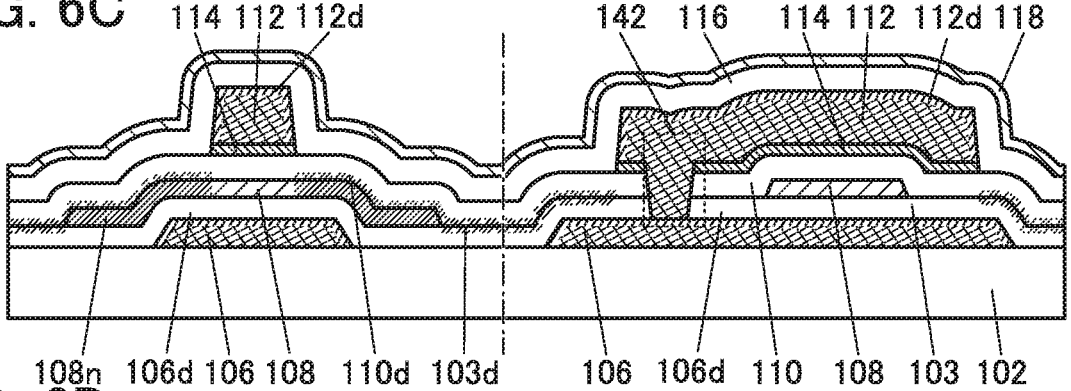

Then, the insulating layer 116 and the insulating layer 118 are formed in this order (FIG. 6(C)). After the above plasma treatment, the insulating layer 116 is preferably formed successively without exposing the conductive layer 112 to the air. The formation of the insulating layer 116 is preferably conducted by a plasma-enhanced chemical vapor deposition (plasma CVD) method. At this time, the plasma treatment and the formation of the insulating layer 116 are preferably performed successively in the same deposition chamber of the same apparatus. In addition, the plasma treatment and the formation of the insulating layer 116 are preferably performed at the same temperature.

As a film formation gas for forming the insulating layer 116 containing an oxide, a mixed gas containing a deposition gas containing a silicon element or the like and the first gas used for the above plasma treatment is preferably used. Using the same gas that contains an oxygen element for the plasma treatment and the formation of the insulating layer 116 can make the interface between the insulating layer 110 and the insulating layer 116 favorable. For example, an $N_2O$ gas is used as the first gas, and a mixed gas containing the $N_2O$ gas and an $SiH_4$ (silane) gas is used as the film formation gas, whereby a silicon oxynitride layer can be formed.

Note that the insulating layer 116 is preferably formed in the treatment chamber where the plasma treatment 150 is performed. Furthermore, treatment for forming the insulating layer 116 is preferably performed at the same temperature as the plasma treatment 150.

Note that the insulating layer 118 is preferably formed as a protective layer that protects the transistor 100. That is, the insulating layer 118, which is provided to prevent outward diffusion of oxygen which might be released from the insulating layer 110, is preferably, but is not limited to be, processed in the same treatment chamber as the insulating layer 116.

In the case where the insulating layer 116 or the insulating layer 118 is formed by a plasma CVD method at a deposition temperature too high, impurities contained in the region 108n and the like might be diffused into a peripheral portion including the channel formation region of the semiconductor layer 108 or the electric resistance of the region 108n might be increased. The deposition temperature of the insulating layer 116 or the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. The formation of the insulating layer 116 or the insulating layer 118 at low temperatures enables the transistor to have favorable electrical characteristics even when the transistor has a short channel length.

[Heat Treatment]

After the formation of the insulating layer 116 or the insulating layer 118, heat treatment is performed. The heat treatment is preferably performed in an atmosphere containing one or more of nitrogen, oxygen, and a rare gas at a temperature higher than or equal to 150° C. and lower than or equal to 450° C., further preferably higher than or equal to 200° C. and lower than or equal to 400° C. The region 108n that has low resistance more stably can be formed by the heat treatment. For example, by the heat treatment at the above temperatures, the impurity element 140 is diffused moderately and homogenized locally, so that the region 108n and the region 110d each having an ideal concentration gradient of the impurity element can be formed. Note that when the temperature of the heat treatment is too high (e.g., higher than or equal to 500° C.), the impurity element 140 is also diffused into the channel formation region, so that the electrical characteristics or reliability of the transistor might be degraded. The region 106d of the conductive layer 106 or the region 112d of the conductive layer 112 is preferably inhibited from being oxidized even when subjected to the heat treatment.

When the impurity element 140 is supplied to the region 108n, defects generated in the semiconductor layer 108 and the insulating layer 110 can be repaired by the heat treatment in some cases.

Furthermore, oxygen can be supplied from the insulating layer 110 to the channel formation region of the semiconductor layer 108 by the heat treatment. In that case, the region 110d supplied with the impurity element 140 is formed in the insulating layer 110 in the vicinity of the interface with the region 108n; thus, oxygen released from the insulating layer 110 is inhibited from being diffused into the region 108n. As a result, the resistance of the region 108n can be effectively prevented from being increased again. In this case, the region 110d is not formed in a portion of the insulating layer 110 that overlaps with the channel formation region of the semiconductor layer 108; thus, oxygen released from the insulating layer 110 can be selectively supplied to the channel formation region.

The region 108n includes a larger amount of oxygen vacancies than the channel formation region; thus, the heat treatment is expected to produce an effect of gettering hydrogen contained in the channel formation region by the oxygen vacancies. Thus, a hydrogen concentration in the channel formation region can be reduced, so that a more reliable transistor can be achieved. Furthermore, hydrogen supplied from the channel formation region is bonded to the oxygen vacancy in the region 108n to serve as a carrier generation source, so that the region 108n that has much lower resistance can be achieved.

Note that the heat treatment may be performed before the insulating layer 116 is formed; further preferably, the heat treatment is performed after the insulating layer 116 or the insulating layer 118 is formed. For example, when an insulating film through which oxygen is less likely to diffuse is used for the insulating layer 116 or the insulating layer 118, oxygen released from the insulating layer 110 by the heat treatment can be prevented from diffusing to the outside, and the amount of oxygen that is to be supplied to the channel formation region of the semiconductor layer 108 can be increased.

[Formation of Opening Portion 141a and Opening Portion 141b]

Next, a mask is formed by lithography in a desired position of the insulating layer 118, and then the insulating layer 118, the insulating layer 116, and the insulating layer 110 are partly etched to form an opening portion 141a and an opening portion 141b reaching the regions 108n.

[Formation of Conductive Layer 120a and Conductive Layer 120b]

Figure 6D:
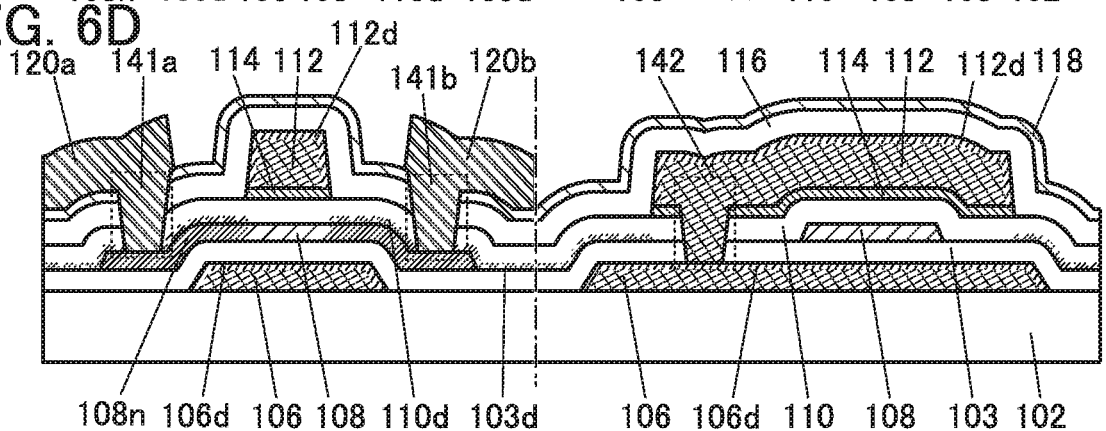

Next, a conductive film is formed over the insulating layer 118 to cover the opening portion 141a and the opening portion 141b, and the conductive film is processed into a desired shape, so that the conductive layer 120a and the conductive layer 120b are formed (FIG. 6(D)).

Through the above process, the transistor 100A can be manufactured. In the case where the transistor 100A is used in a pixel of a display device, for example, this process may be followed by a step of forming one or more of a protective insulating layer, a planarization layer, a pixel electrode, and a wiring.

The above is the description of the manufacturing method example.

At least part of the structure example, the manufacturing method example, the drawings corresponding thereto, and the like illustrated in this embodiment can be implemented in combination with any of the other structure examples, manufacturing method examples, other drawings, and the like as appropriate.

At least part of this embodiment can be implemented in combination with the other embodiments described in this specification as appropriate.

Embodiment 2

In this embodiment, examples of a display device that includes the transistors illustrated in the above embodiment will be described.

Structure Example

Figure 7A:
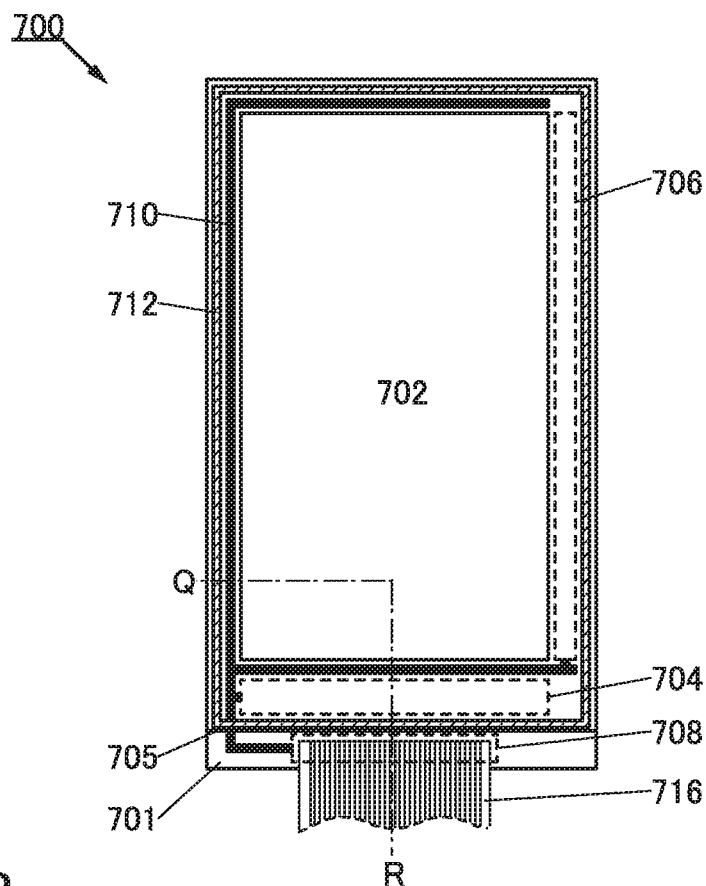
FIGS. 7 (A) and (B) are top views of a display device.

FIG. 7(A) shows a top view of a display device 700. The display device 700 includes a first substrate 701 and a second substrate 705 that are attached to each other with a sealant 712. In addition, over the first substrate 701, a pixel portion 702, a source driver circuit portion 704, and a gate driver circuit portion 706 are provided in a region sealed with the first substrate 701, the second substrate 705, and the sealant 712. Furthermore, a plurality of display elements are provided in the pixel portion 702.

A portion of the first substrate 701 that does not overlap with the second substrate 705 is provided with an FPC terminal portion 708 to which an FPC 716 (FPC: Flexible Printed Circuit) is connected. The pixel portion 702, the source driver circuit portion 704, and the gate driver circuit portion 706 are supplied with a variety of signals and the like from the FPC 716 through the FPC terminal portion 708 and a signal line 710.

A plurality of gate driver circuit portions 706 may be provided. In addition, each of the gate driver circuit portion 706 and the source driver circuit portion 704 may be formed separately over a semiconductor substrate or the like and may be in the form of a packaged IC chip. The IC chip can be mounted over the first substrate 701 or on the FPC 716.

The transistor that is a semiconductor device of one embodiment of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. Examples of the light-emitting element include self-luminous elements such as an LED (Light Emitting Diode), an OLED (Organic LED), a QLED (Quantum-dot LED), and a semiconductor laser. Moreover, a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like can also be used, for example.

Figure 7B:
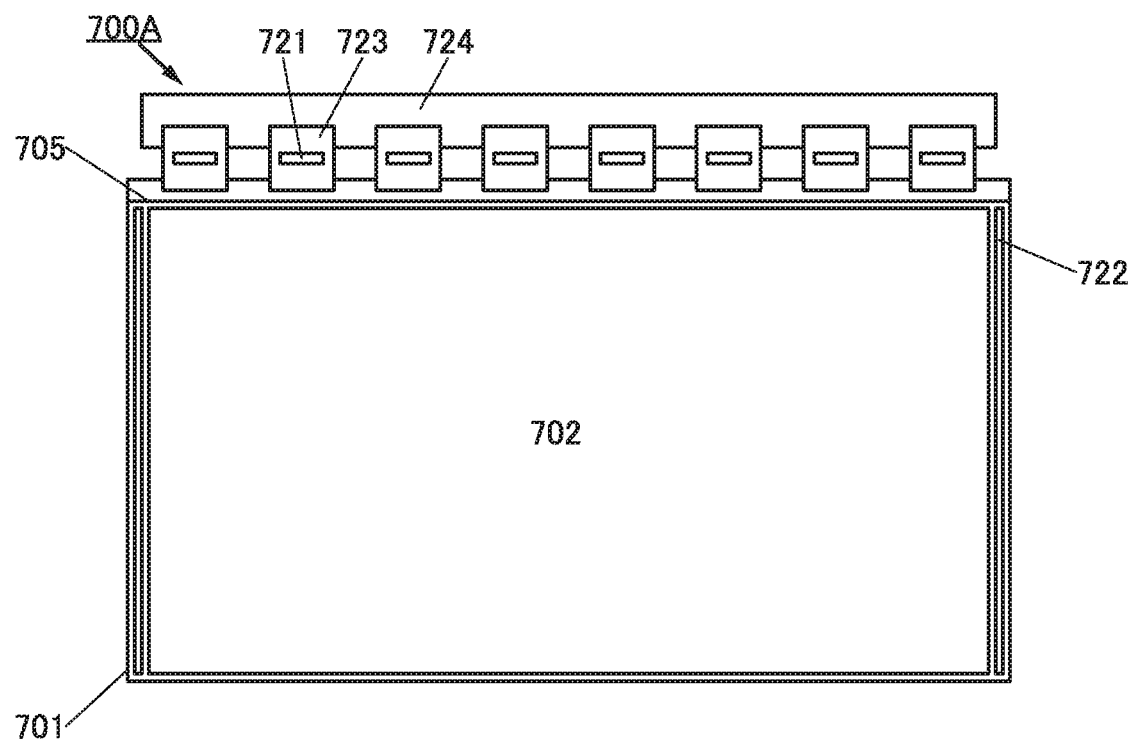

A display device 700A shown in FIG. 7(B) is a display device that can be suitably used for an electronic device with a large screen. For example, the display device 700A can be suitably used for a television device, a monitor device, a personal computer (including a laptop personal computer and a desktop personal computer), a tablet terminal, digital signage, or the like.

The display device 700A includes a plurality of source driver ICs 721 and a pair of gate driver circuit portions 722.

The plurality of source driver ICs 721 are attached to respective FPCs 723. In addition, in each of the plurality of FPCs 723, one terminal is connected to the first substrate 701, and the other terminal is connected to a printed circuit board 724. By bending the FPCs 723, the printed circuit board 724 can be placed on a rear side of the pixel portion 702 to be mounted on an electronic device; thus, the space of the electronic device can be saved.

On the other hand, the gate driver circuit portions 722 are formed over the first substrate 701. Thus, an electronic device with a narrow frame can be achieved.

With such a structure, a large high-resolution display device can be achieved. For example, such a structure can also be applied to a display device whose screen diagonal is greater than or equal to 30 inches, greater than or equal to 40 inches, greater than or equal to 50 inches, or greater than or equal to 60 inches. Furthermore, a display device with extremely high resolution such as 4K2K or 8K4K can be achieved.

Cross-Sectional Structure Example

Figure 8:
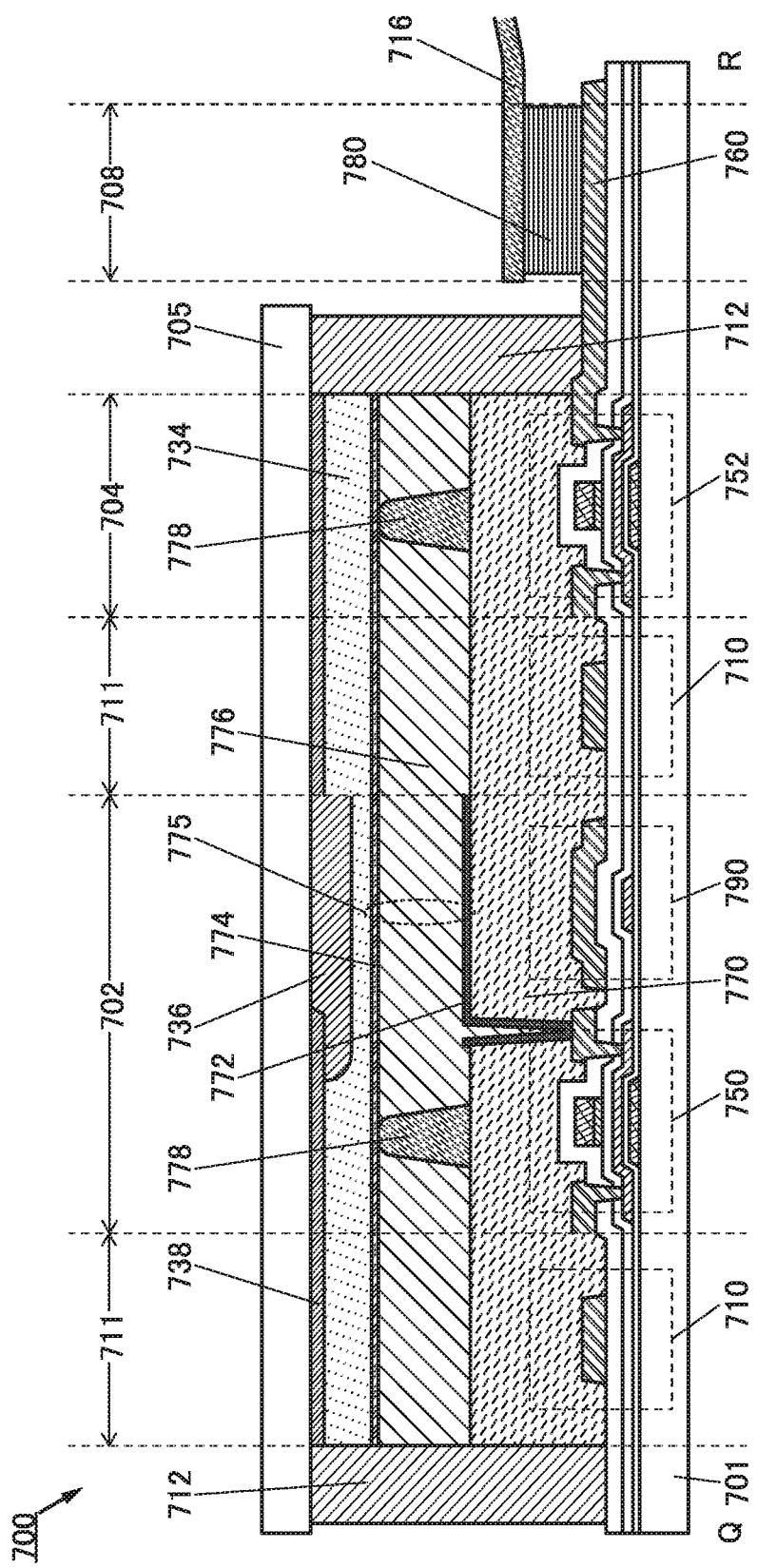
FIG. 8 A cross-sectional view of a display device.
Figure 9:
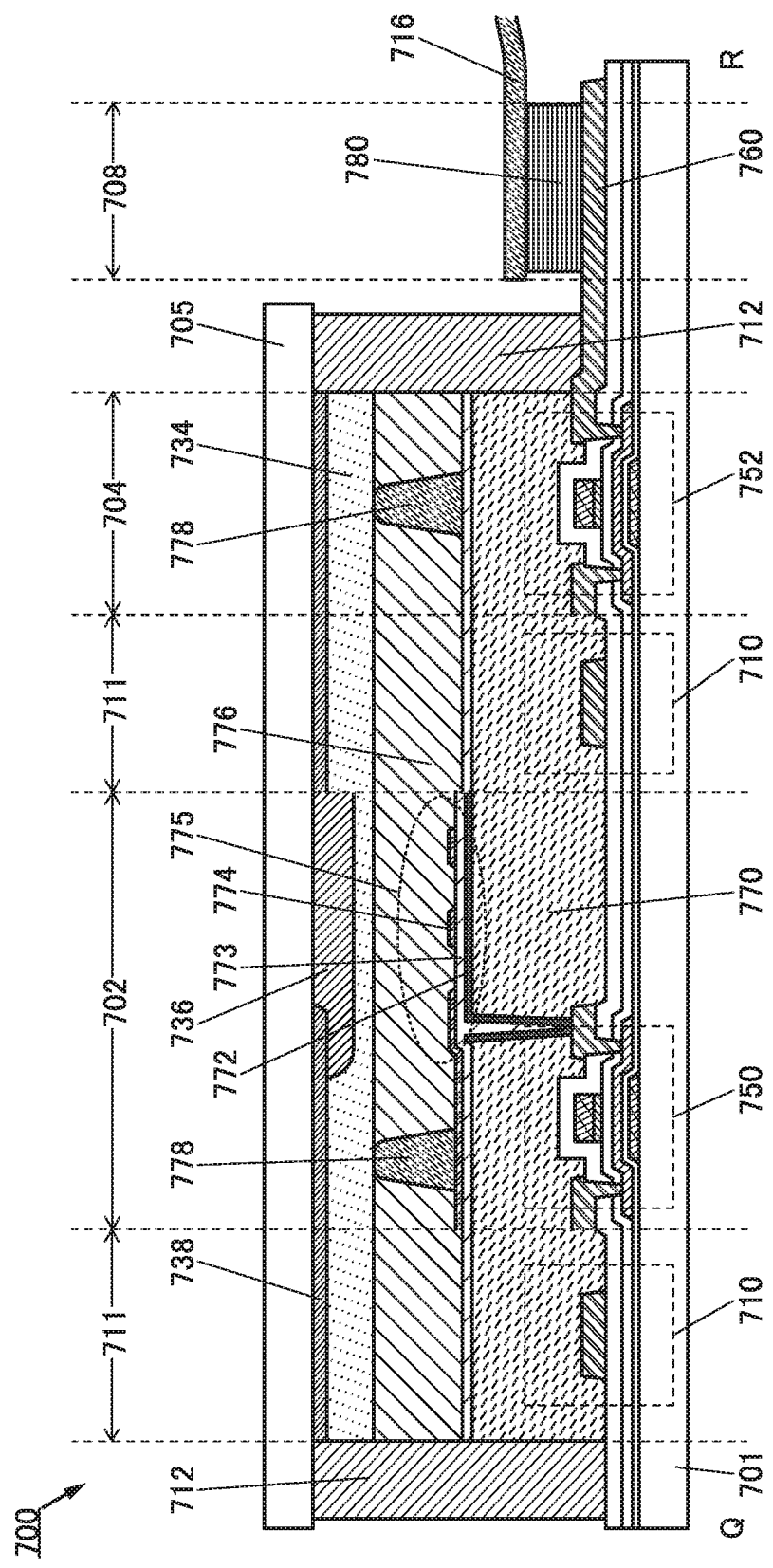
FIG. 9 A cross-sectional view of a display device.
Figure 10:
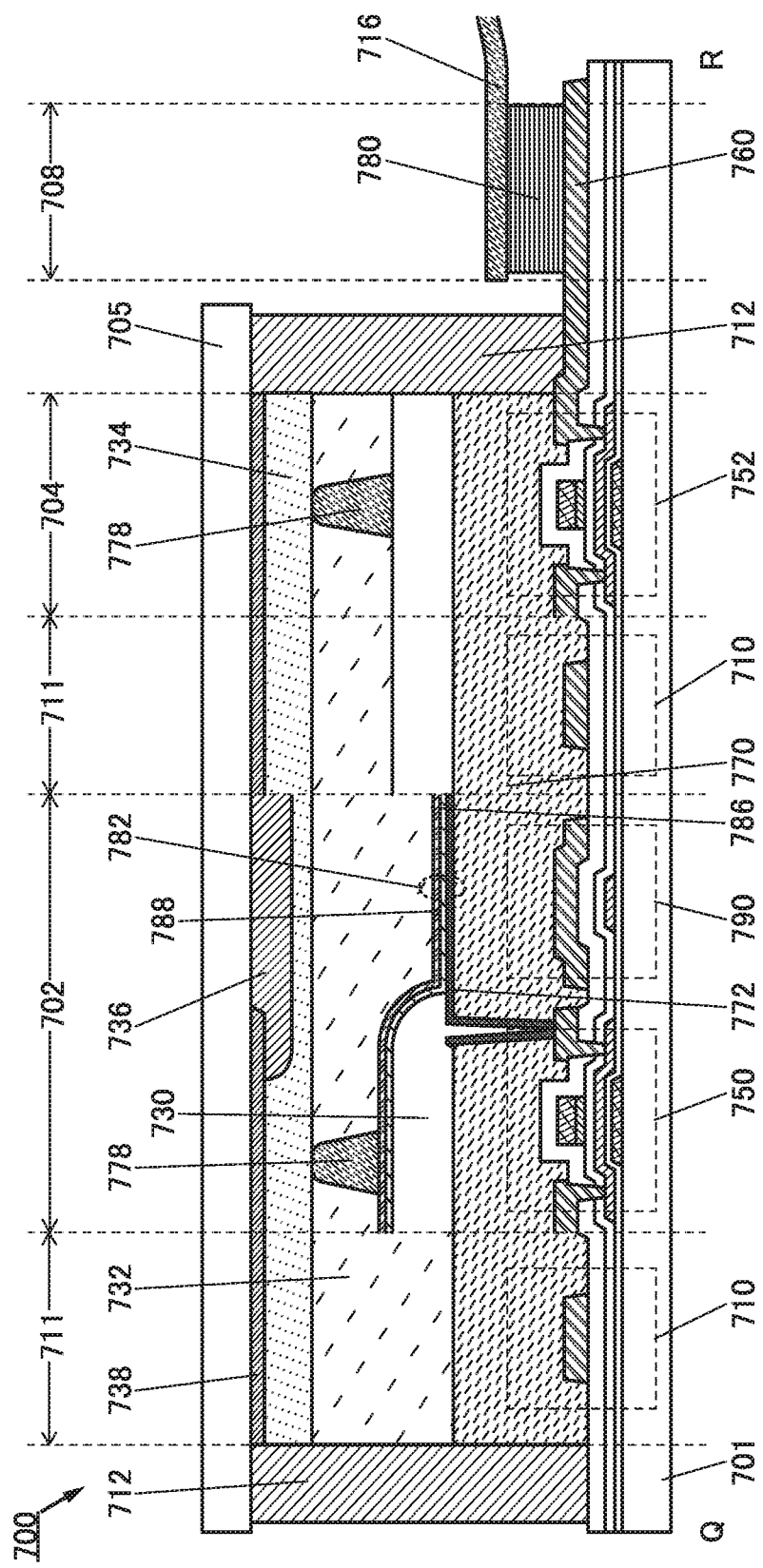
FIG. 10 A cross-sectional view of a display device.

Structures using a liquid crystal element or an EL element as a display element are described below with reference to FIG. 8 to FIG. 10. Note that FIG. 8 to FIG. 10 are cross-sectional views taken along the dashed-dotted line Q-R in FIG. 7(A). FIG. 8 and FIG. 9 each illustrate a structure using a liquid crystal element as a display element, and FIG. 10 illustrates a structure using an EL element.

[Description of Common Portions in Display Devices]

The display device 700 shown in FIG. 8 to FIG. 10 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 9 illustrates the case where the capacitor 790 is not provided.

The transistors illustrated in Embodiment 1 can be used as the transistor 750 and the transistor 752.

The transistors used in this embodiment each include an oxide semiconductor film that is highly purified and in which formation of oxygen vacancies is inhibited. The transistors can each have a low off-state current. Accordingly, the holding time of an electrical signal such as an image signal can be made longer, and an interval between writings of image signals and the like can also be set longer in a power on state. Therefore, the frequency of refresh operations can be reduced, producing an effect of reducing power consumption.

In addition, the transistors used in this embodiment can have comparatively high field-effect mobility and thus are capable of high-speed operation. For example, with the use of such transistors capable of high-speed operation for a display device, a switching transistor in a pixel portion and a driver transistor used in a driver circuit portion can be formed over one substrate. That is, a semiconductor device formed with a silicon wafer or the like is not additionally needed as a driver circuit; thus, the number of components of the semiconductor device can be reduced. Moreover, when the transistors capable of high-speed operation are used also in the pixel portion, a high-quality image can be provided.

The capacitor 790 shown in FIG. 8 and FIG. 10 includes a lower electrode formed in such a manner that the same film as the semiconductor layer of the transistor 750 is processed and the resistance is lowered, and an upper electrode formed by processing the same conductive film as that for a source electrode or a drain electrode. Furthermore, two insulating films covering the transistor 750 are provided between the lower electrode and the upper electrode. That is, the capacitor 790 has a stacked-layer structure in which the insulating films functioning as dielectric films are positioned between a pair of electrodes.

A planarization insulating film 770 is provided over the transistor 750, the transistor 752, and the capacitor 790.

As the transistor 750 included in the pixel portion 702 and the transistor 752 included in the source driver circuit portion 704, transistors having different structures may be used. For example, a top-gate transistor may be used as one of the transistors and a bottom-gate transistor may be used as the other. Note that the source driver circuit portion 704 described above may be replaced with a gate driver circuit portion.

The signal line 710 is formed using the same conductive film as that for the source electrodes and the drain electrodes of the transistors 750 and 752, and the like. Here, a low-resistance material such as a material containing a copper element is preferably used, in which case signal delay or the like due to wiring resistance can be reduced and display on a large screen is possible.

The FPC terminal portion 708 includes a connection electrode 760, an anisotropic conductive film 780, and the FPC 716. The connection electrode 760 is electrically connected to a terminal of the FPC 716 through the anisotropic conductive film 780. Here, the connection electrode 760 is formed using the same conductive film as that for the source electrodes and the drain electrodes of the transistors 750 and 752, and the like.

As the first substrate 701 and the second substrate 705, a glass substrate or a flexible substrate such as a plastic substrate can be used, for example.

On the second substrate 705 side, a light-blocking film 738, a coloring film 736, and an insulating film 734 that is in contact with these films are provided.

[Structure Example of Display Device Using Liquid Crystal Element]

The display device 700 shown in FIG. 8 includes a liquid crystal element 775. The liquid crystal element 775 includes a conductive layer 772, a conductive layer 774, and a liquid crystal layer 776 provided therebetween. The conductive layer 774 is provided on the second substrate 705 side and has a function of a common electrode. In addition, the conductive layer 772 is electrically connected to the source electrode or the drain electrode of the transistor 750. The conductive layer 772 is formed over the planarization insulating film 770 and functions as a pixel electrode.

For the conductive layer 772, a material having a visible-light-transmitting property or a material having a visible-light-reflecting property can be used. An oxide material containing indium, zinc, tin, or the like is preferably used as the light-transmitting material, for example. A material containing aluminum, silver, or the like is preferably used as the reflective material, for example.

When a reflective material is used for the conductive layer 772, the display device 700 is a reflective liquid crystal display device. On the other hand, when a light-transmitting material is used for the conductive layer 772, the display device 700 is a transmissive liquid crystal display device. In the case of a reflective liquid crystal display device, a polarizing plate is provided on the viewer side. On the other hand, in the case of a transmissive liquid crystal display device, a pair of polarizing plates are provided such that the liquid crystal element is sandwiched therebetween.

The display device 700 shown in FIG. 9 is an example in which the liquid crystal element 775 in a horizontal electric field mode (e.g., an FFS mode) is used. The conductive layer 774 functioning as a common electrode is provided over the conductive layer 772 with an insulating layer 773 therebetween. The alignment state of the liquid crystal layer 776 can be controlled by an electric field generated between the conductive layer 772 and the conductive layer 774.

In FIG. 9, a storage capacitor can be composed of a stacked-layer structure of the conductive layer 774, the insulating layer 773, and the conductive layer 772. Therefore, it is not necessary to provide a capacitor separately, and thus the aperture ratio can be increased.

Although not shown in FIG. 8 and FIG. 9, an alignment film in contact with the liquid crystal layer 776 may be provided. Furthermore, an optical member (an optical substrate) such as a polarizing member, a retardation member, or an anti-reflection member and a light source such as a backlight or a side light can be provided as appropriate.

For the liquid crystal layer 776, thermotropic liquid crystal, low-molecular liquid crystal, high-molecular liquid crystal, polymer dispersed liquid crystal, polymer network liquid crystal, ferroelectric liquid crystal, anti-ferroelectric liquid crystal, or the like can be used. In the case of employing a horizontal electric field mode, liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like can be employed.

[Display Device Using Light-Emitting Element]

The display device 700 shown in FIG. 10 includes a light-emitting element 782. The light-emitting element 782 includes the conductive layer 772, an EL layer 786, and a conductive film 788. The EL layer 786 contains an organic compound or an inorganic compound such as a quantum dot.

Examples of materials that can be used for an organic compound include a fluorescent material and a phosphorescent material. In addition, examples of materials that can be used for a quantum dot include a colloidal quantum dot material, an alloyed quantum dot material, a core-shell quantum dot material, and a core quantum dot material.

In the display device 700 shown in FIG. 10, an insulating film 730 covering part of the conductive layer 772 is provided over the planarization insulating film 770. Here, the light-emitting element 782 is a top-emission light-emitting element including the light-transmitting conductive film 788. Note that the light-emitting element 782 may have a bottom-emission structure in which light is emitted to the conductive layer 772 side or a dual-emission structure in which light is emitted to both the conductive layer 772 side and the conductive film 788 side.

The coloring film 736 is provided in a position overlapping with the light-emitting element 782, and the light-blocking film 738 is provided in a position overlapping with the insulating film 730 and in the lead wiring portion 711 and the source driver circuit portion 704. The coloring film 736 and the light-blocking film 738 are covered with the insulating film 734. A space between the light-emitting element 782 and the insulating film 734 is filled with a sealing film 732. Note that a structure without the coloring film 736 may also be employed in the case where the EL layer 786 is formed into an island shape per pixel or a stripe shape per pixel column, i.e., formed by separate coloring.

[Structure Example of Display Device Provided with Input Device]

In addition, an input device may be provided in the display device 700 shown in FIG. 8 to FIG. 10. Examples of the input device include a touch sensor.

For example, a variety of types such as a capacitive type, a resistive type, a surface acoustic wave type, an infrared type, an optical type, and a pressure-sensitive type can be used for the sensor. Alternatively, a combination of two or more of these types may be employed.

Note that examples of a touch panel structure include what is called an in-cell touch panel in which an input device is formed inside a pair of substrates, what is called an on-cell touch panel in which an input device is formed over the display device 700, and what is called an out-cell touch panel that is attached to the display device 700 to be used.

At least part of the structure examples, the drawings corresponding thereto, and the like illustrated in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device that includes a semiconductor device of one embodiment of the present invention is described with reference to FIG. 11.

Figure 11A:
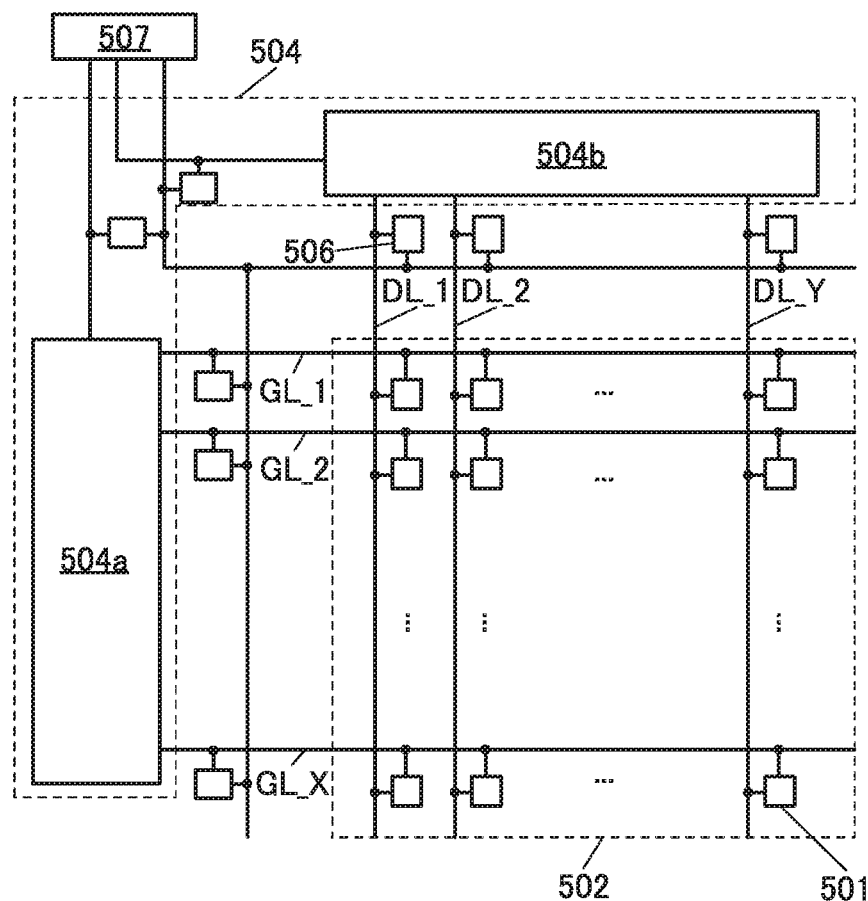
FIG. 11 (A) is a block diagram of a display device, and (B) and (C) are circuit diagrams.

The display device shown in FIG. 11(A) includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. In addition, the transistor of one embodiment of the present invention can also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scan signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is supplied to a wiring to which the protection circuit 506 is connected, establishes continuity between the wiring and another wiring. The protection circuit 506 shown in FIG. 11(A) is connected to, for example, a variety of wirings such as scan lines GL, which are wirings between the gate driver 504a and the pixel circuits 501, and data lines DL, which are wirings between the source driver 504b and the pixel circuits 501.

The gate driver 504a and the source driver 504b may be provided over the same substrate as the pixel portion 502, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 11B:
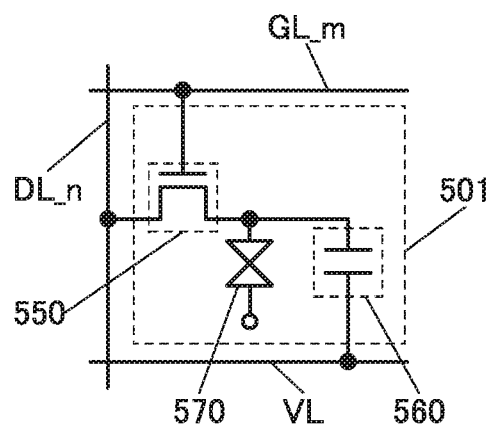
Figure 11C:
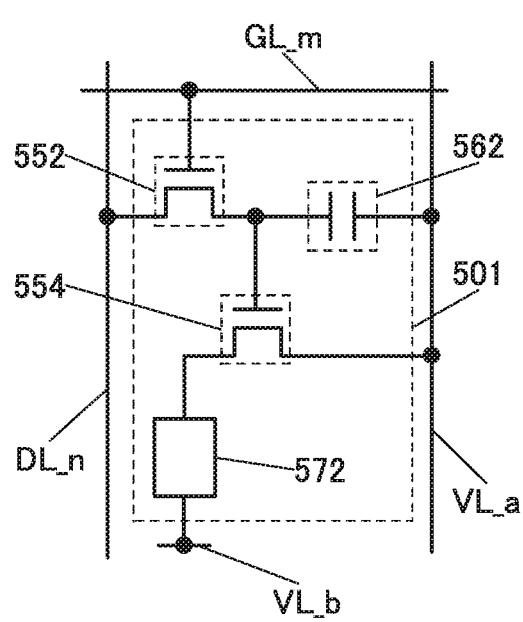

The plurality of pixel circuits 501 shown in FIG. 11(A) can have a configuration shown in FIGS. 11(B) and 11(C), for example.

The pixel circuit 501 shown in FIG. 11(B) includes a liquid crystal element 570, a transistor 550, and a capacitor 560. In addition, a data line DL_n, a scan line GL_m, a potential supply line VL, and the like are connected to the pixel circuit 501.

The potential of one of a pair of electrodes of the liquid crystal element 570 is set in accordance with the specifications of the pixel circuit 501 as appropriate. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 shown in FIG. 11(C) includes transistors 552 and 554, a capacitor 562, and a light-emitting element 572. Furthermore, the data line DL_n, the scan line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential $V_{SS}$ is supplied to the other. Current flowing through the light-emitting element 572 is controlled in accordance with a potential supplied to a gate of the transistor 554, so that the luminance of light emitted from the light-emitting element 572 is controlled.

At least part of the structure examples, the drawings corresponding thereto, and the like illustrated in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit are described below. The transistor illustrated in Embodiment 1 can be used as a transistor used in the pixel circuit illustrated below.

[Circuit Configuration]

Figure 12A:
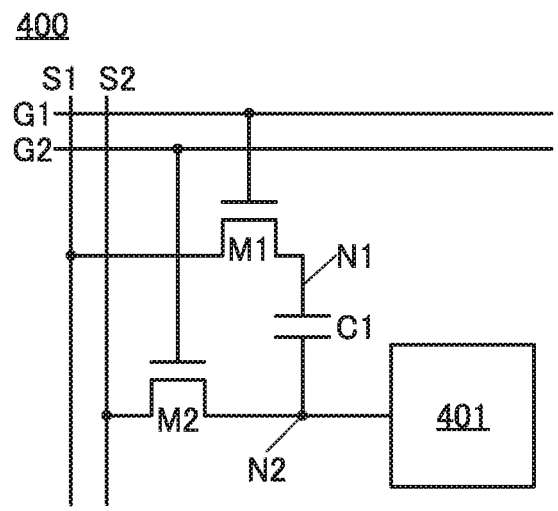
FIGS. 12 (A), (C), and (D) are circuit diagrams of a display device, and (B) is a timing chart.

FIG. 12(A) shows a circuit diagram of a pixel circuit 400. The pixel circuit 400 includes a transistor M1, a transistor M2, a capacitor C1, and a circuit 401. In addition, a wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. A variety of elements can be used as the display element, and typically, a light-emitting element such as an organic EL element or an LED element, a liquid crystal element, a MEMS (Micro Electro Mechanical Systems) element, or the like can be employed.

A node connecting the transistor M1 and the capacitor C1 is denoted as N1, and a node connecting the transistor M2 and the circuit 401 is denoted as N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is illustrated in Embodiment 1, can be used as one or both of the transistor M1 and the transistor M2. Accordingly, the potentials of the node N1 and the node N2 can be retained for a long time owing to an extremely low off-state current. Note that in the case where the period in which the potential of each node is retained is short (specifically, the case where the frame frequency is higher than or equal to 30 Hz, for example), a transistor using a semiconductor such as silicon may be used.

Driving Method Example

Figure 12B:
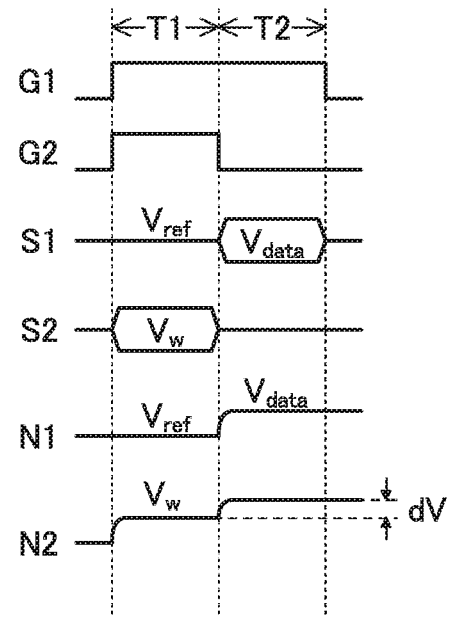

Next, an example of a method for operating the pixel circuit 400 is described with reference to FIG. 12(B). FIG. 12(B) is a timing chart of the operation of the pixel circuit 400. Note that here, for simplification of description, the influence of a variety of resistance such as wiring resistance, the parasitic capacitance of a transistor, a wiring, and the like, the threshold voltage of a transistor, and the like are not taken into consideration.

In the operation shown in FIG. 12(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w$-$V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 by a potential dV in accordance with the second data potential $V_{data}$. That is, a potential that is the sum of the first data potential $V_w$ and the potential dV is input to the circuit 401. Note that although the potential dV is shown as having a positive value in FIG. 12(B), it may have a negative value. In other words, the potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

As described above, a potential to be supplied to the circuit 401 including the display element can be generated by a combination of two kinds of data signals in the pixel circuit 400, so that gray levels can be corrected in the pixel circuit 400.

The pixel circuit 400 can generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

Application Examples

Example Using Liquid Crystal Element

Figure 12C:
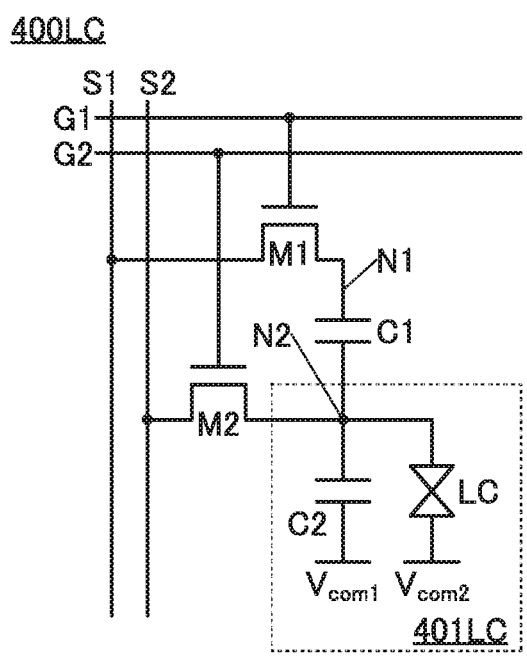

A pixel circuit 400LC shown in FIG. 12(C) includes a circuit 401LC. The circuit 401LC includes a liquid crystal element LC and a capacitor C2.

One electrode of the liquid crystal element LC is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high drive voltage can be employed, for example. In addition, gray levels can also be corrected in accordance with the operating temperature, the degradation state of the liquid crystal element LC, or the like by supply of a correction signal to the wiring S1 or the wiring S2.

Example Using Light-Emitting Element

Figure 12D:
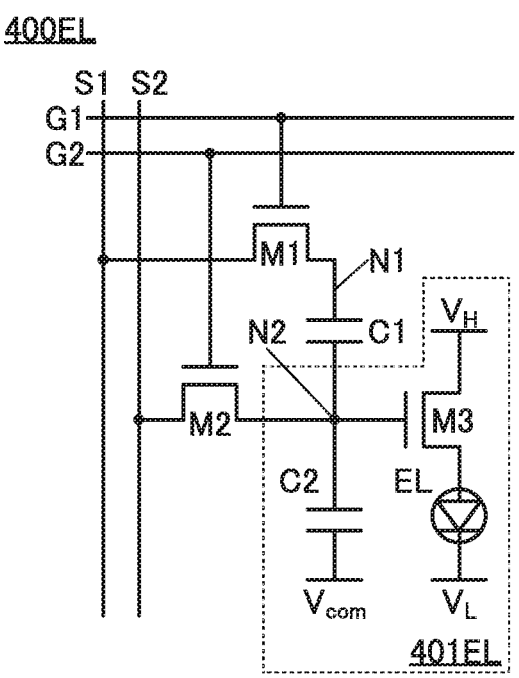

A pixel circuit 400EL shown in FIG. 12(D) includes a circuit 401EL. The circuit 401EL includes a light-emitting element EL, a transistor M3, and the capacitor C2.

In the transistor M3, a gate is connected to the node $N_2$ and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be changed as appropriate.

In the pixel circuit 400EL, a large amount of current can flow through the light-emitting element EL when a high potential is supplied to the gate of the transistor M3, which enables HDR display or the like, for example. In addition, a variation in the electrical characteristics of the transistor M3 and the light-emitting element EL can also be corrected by supply of a correction signal to the wiring S1 or the wiring S2.

Note that without limitation to the circuits shown in FIGS. 12(C) and 12(D), a configuration to which a transistor, a capacitor, or the like is further added may be employed.

At least part of this embodiment can be implemented in combination with the other embodiments described in this specification as appropriate.

Embodiment 5

In this embodiment, a display module that can be manufactured using one embodiment of the present invention will be described.

Figure 13A:
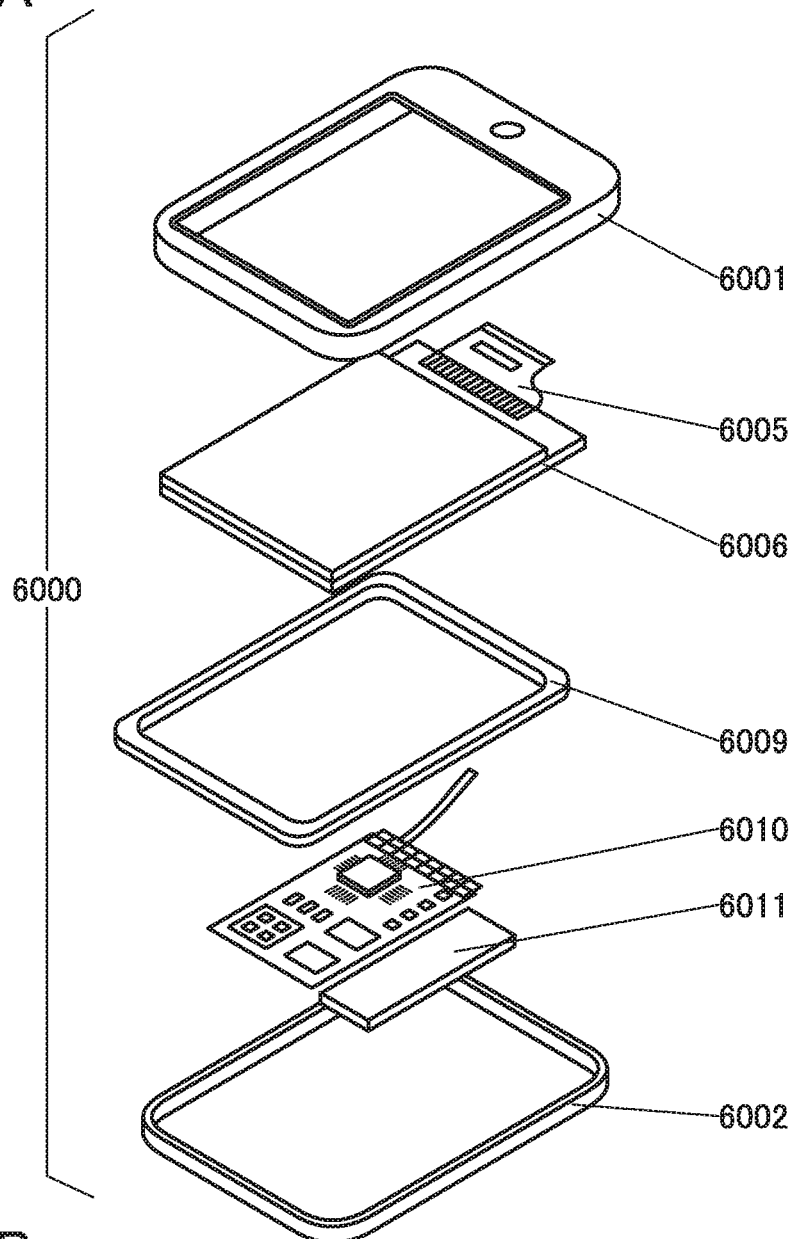
FIGS. 13 (A) and (B) are structure examples of a display module.

In a display module 6000 shown in FIG. 13(A), a display device 6006 to which an FPC 6005 is connected, a frame 6009, a printed circuit board 6010, and a battery 6011 are provided between an upper cover 6001 and a lower cover 6002.

A display device manufactured using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. The battery 6011 may be used as a power supply for supplying power to the power supply circuit.

Figure 13B:
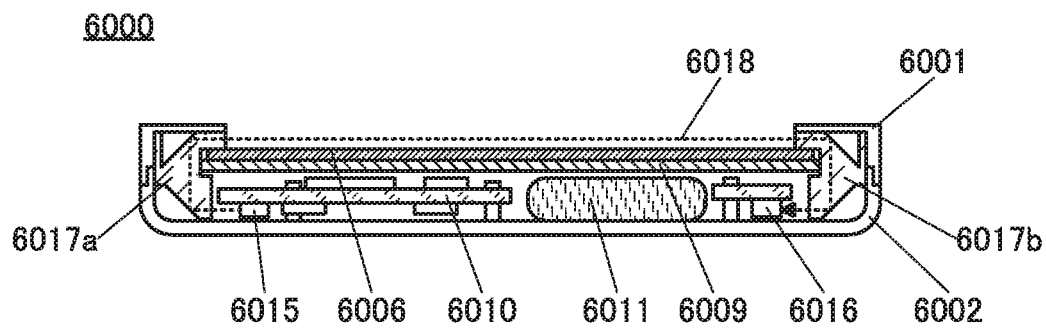

FIG. 13(B) is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in a region surrounded by the upper cover 6001 and the lower cover 6002.

The display device 6006 is provided to overlap with the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at positions facing the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts the light into an electrical signal can be used. A photodiode that can receive infrared rays can be suitably used.

With the use of the light guide portion 6017a and the light guide portion 6017b that transmit the light 6018, the light-emitting portion 6015 and the light-receiving portion 6016 can be placed below the display device 6006, and malfunction of the touch sensor due to external light reaching the light-receiving portion 6016 can be inhibited. Particularly when a resin that absorbs visible light and transmits infrared rays is used, malfunction of the touch sensor can be inhibited more effectively.

At least part of this embodiment can be implemented in combination with the other embodiments described in this specification as appropriate.

Embodiment 6

In this embodiment, electronic devices each including a display device manufactured using one embodiment of the present invention will be described.

Electronic devices illustrated below each include a display device of one embodiment of the present invention in a display portion. Thus, the electronic devices achieve high resolution. In addition, the electronic devices can achieve both high resolution and a large screen.

The display portion of the electronic device of one embodiment of the present invention can display an image with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a laptop personal computer, a monitor device, digital signage, a pachinko machine, and a game machine.

The electronic device using one embodiment of the present invention can be incorporated along a flat surface or a curved surface of an inside wall or an outside wall of a house or a building, an interior or an exterior of a car, or the like.

Figure 14A:
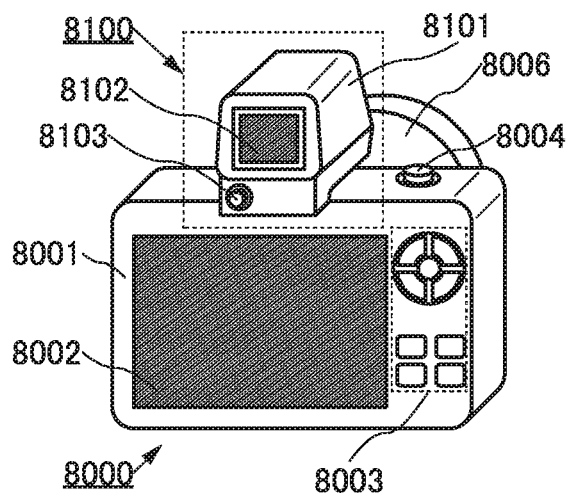
FIGS. 14 (A), (B), (C), (D), and (E) are structure examples of electronic devices.

FIG. 14(A) is a diagram showing the appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or the touch on the display portion 8002 functioning as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. In the finder 8100, an image or the like received from the camera 8000 can be displayed on the display portion 8102.

The button 8103 has a function of a power button or the like.

The display device of one embodiment of the present invention can be used in the display portion 8002 of the camera 8000 and the display portion 8102 of the finder 8100. Note that a finder may be incorporated in the camera 8000.

Figure 14B:
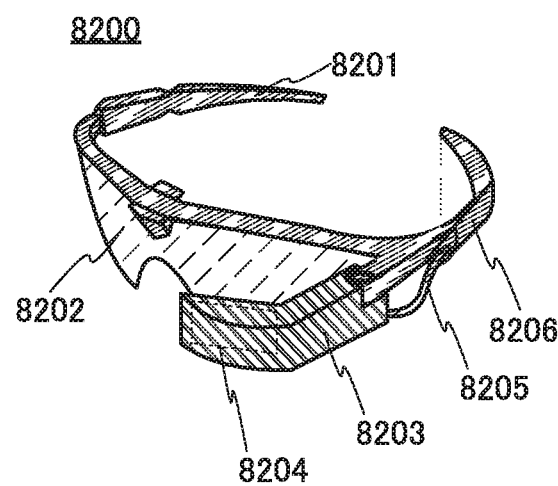

FIG. 14(B) is a diagram showing the appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information on the display portion 8204. The main body 8203 is provided with a camera, and information on the movement of the user's eyeball and eyelid can be used as an input means.

In the mounting portion 8201, a plurality of electrodes capable of sensing current flowing in response to the movement of the user's eyeball may be provided at positions in contact with the user so that the mounting portion 8201 can have a function of recognizing the user's gaze. A function of monitoring the user's pulse with the use of current flowing through the electrodes may be provided. Moreover, the mounting portion 8201 may include a variety of sensors such as a temperature sensor, a pressure sensor, and an acceleration sensor to have a function of displaying the user's biological information on the display portion 8204 or a function of changing an image displayed on the display portion 8204 in accordance with the movement of the user's head.

The display device of one embodiment of the present invention can be used in the display portion 8204.

Figure 14C:
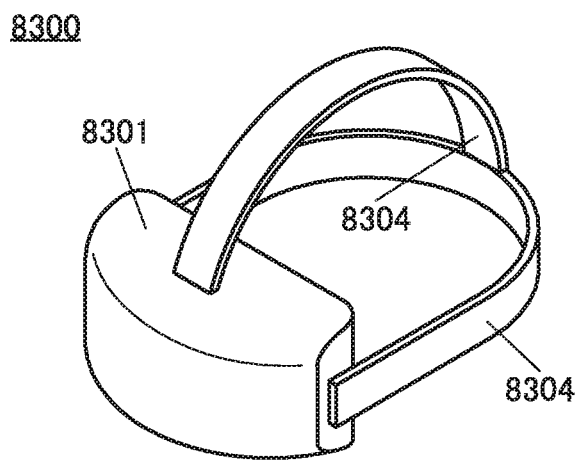
Figure 14D:
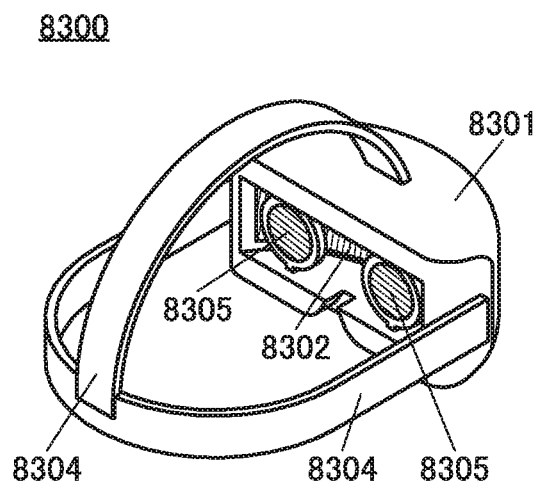
Figure 14E:
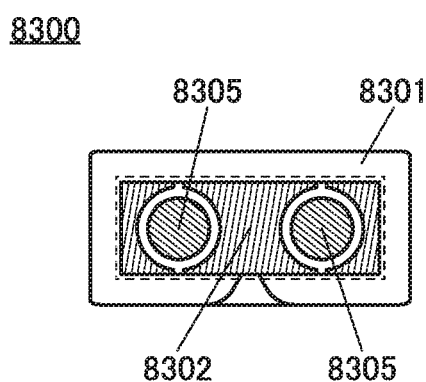

FIGS. 14(C), 14(D), and 14(E) are diagrams showing the appearance of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably installed in a state of being curved, in which case the user can feel a high realistic sensation. In addition, when another image displayed in a different region of the display portion 8302 is viewed through the lenses 8305, 3D display using parallax or the like can also be performed. Note that the structure is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when a video is magnified using the lenses 8305 as in FIG. 14(E), a more realistic video can be displayed while the user does not see individual pixels.

Electronic devices shown in FIG. 15(A) to FIG. 15(G) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, a gradient, oscillation, an odor, or infrared rays), a microphone 9008, and the like.

The electronic devices shown in FIG. 15(A) to FIG. 15(G) have a variety of functions. For example, the electronic devices can have a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of reading out and processing a program or data stored in a recording medium, and the like. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (an external recording medium or a recording medium incorporated in the camera), a function of displaying the taken image on the display portion, and the like.

The details of the electronic devices shown in FIG. 15(A) to FIG. 15(G) are described below.

Figure 15A:
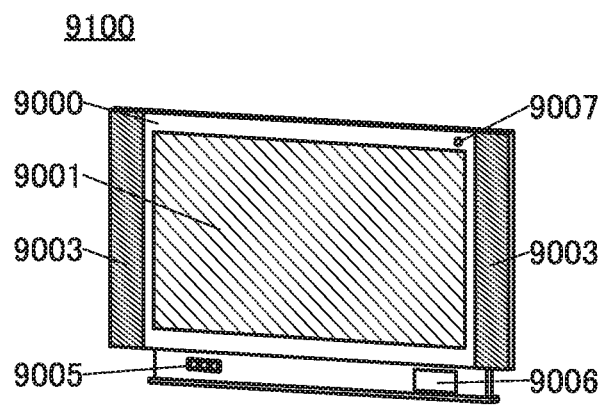
FIGS. 15 (A), (B), (C), (D), (E), (F), and (G) are structure examples of electronic devices.

FIG. 15(A) is a perspective view showing a television device 9100. In the television device 9100, the display portion 9001 having a large screen size of, for example, 50 inches or more, or 100 inches or more can be incorporated.

Figure 15D:
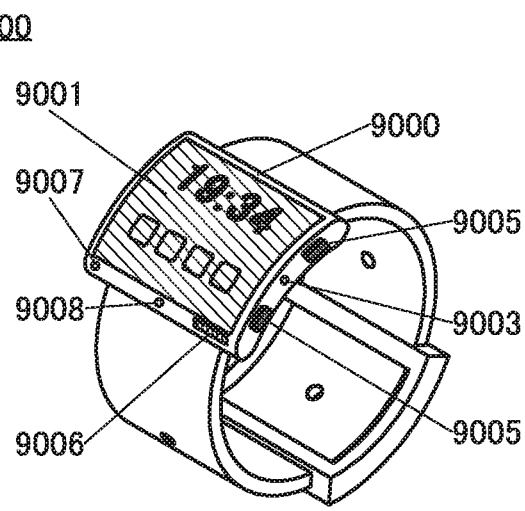
Figure 15B:
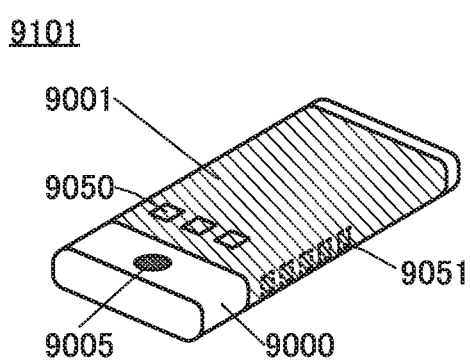

FIG. 15(B) is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. In addition, the portable information terminal 9101 can display letters and image information on its plurality of surfaces. FIG. 15(B) shows an example in which three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed at the position where the information 9051 is displayed.

Figure 15E:
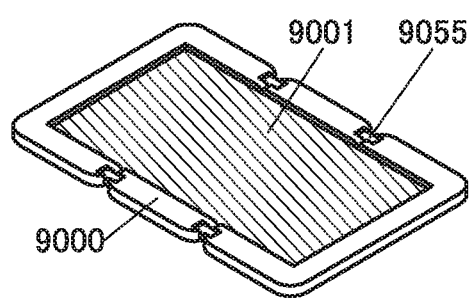
Figure 15C:
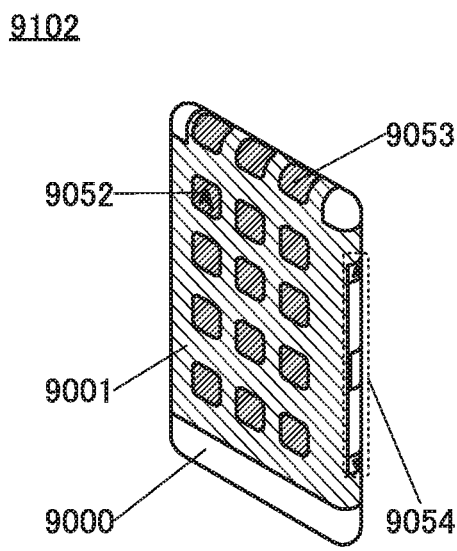

FIG. 15(C) is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer a call, for example.

FIG. 15(D) is a perspective view showing a watch-type portable information terminal 9200. For example, the portable information terminal 9200 can be used as a smart watch. The display portion 9001 is provided such that its display surface is curved, and display can be performed along the curved display surface. Mutual communication between the portable information terminal 9200 and, for example, a headset capable of wireless communication enables hands-free calling. Moreover, with the connection terminal 9006, the portable information terminal 9200 can also perform mutual data transmission with another information terminal and charging. Note that the charging operation may be performed by wireless power feeding.

Figure 15F:
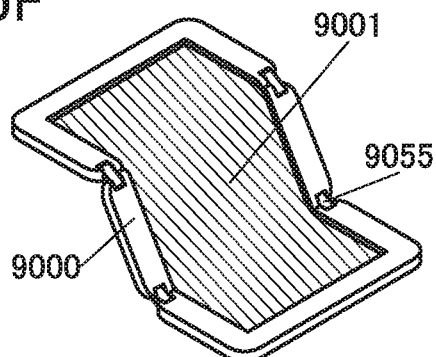
Figure 15G:
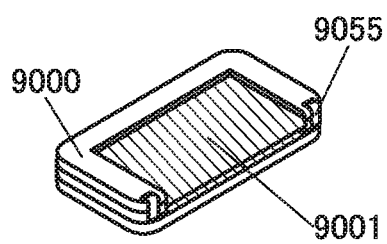

FIGS. 15(E), 15(F), and 15(G) are perspective views showing a foldable portable information terminal 9201. FIG. 15(E) is a perspective view of an unfolded state of the portable information terminal 9201, FIG. 15(G) is a perspective view of a folded state thereof, and FIG. 15(F) is a perspective view of a state in the middle of change from one of FIG. 15(E) and FIG. 15(G) to the other. The portable information terminal 9201 is highly portable in the folded state and is highly browsable in the unfolded state because of a seamless large display region. The display portion 9001 of the portable information terminal 9201 is supported by three housings 9000 joined with hinges 9055. For example, the display portion 9001 can be bent with a radius of curvature of greater than or equal to 1 mm and less than or equal to 150 mm.

Figure 16A:
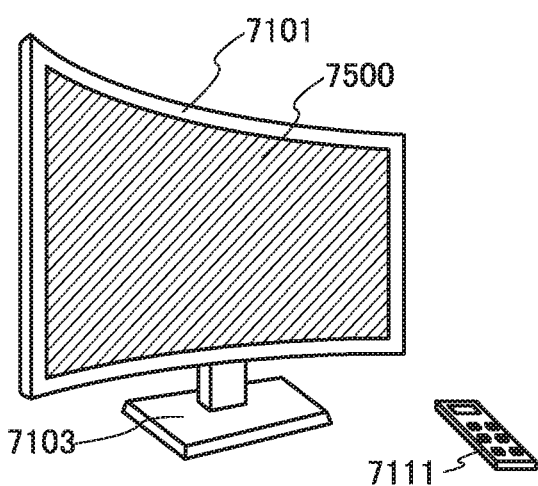
FIGS. 16 (A), (B), (C), and (D) are structure examples of electronic devices.

FIG. 16(A) illustrates an example of a television device. In a television device 7100, a display portion 7500 is incorporated in a housing 7101. Here, a structure in which the housing 7101 is supported by a stand 7103 is illustrated.

Operation of the television device 7100 shown in FIG. 16(A) can be performed with an operation switch provided in the housing 7101 or a separate remote controller 7111. Alternatively, a touch panel may be used in the display portion 7500, and the television device 7100 may be operated by touch on the touch panel. The remote controller 7111 may include a display portion in addition to operation buttons.

Note that the television device 7100 may include a television receiver and a communication device for network connection.

Figure 16B:
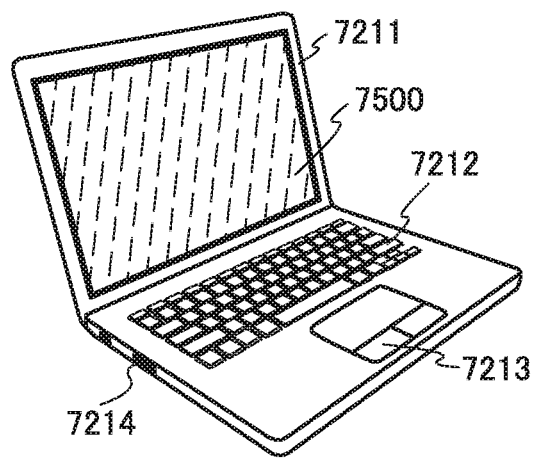

FIG. 16(B) shows a laptop personal computer 7200. The laptop personal computer 7200 includes a housing 7211, a keyboard 7212, a pointing device 7213, an external connection port 7214, and the like. The display portion 7500 is incorporated in the housing 7211.

Figure 16C:
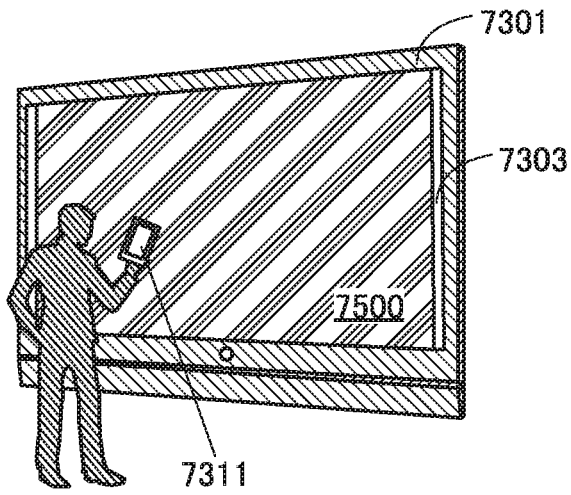
Figure 16D:
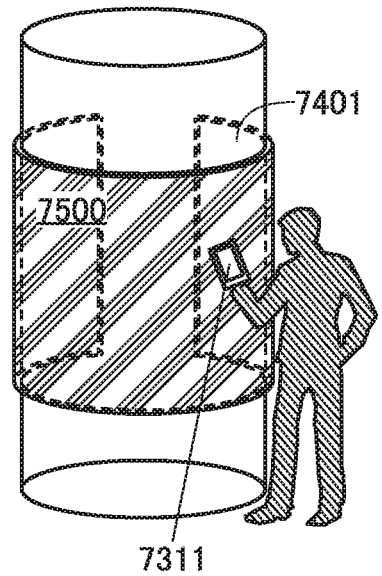

FIGS. 16(C) and 16(D) show examples of digital signage.

Digital signage 7300 shown in FIG. 16(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 16(D) is digital signage 7400 attached to a cylindrical pillar 7401. The digital signage 7400 includes the display portion 7500 provided along a curved surface of the pillar 7401.

The display portion 7500 with a larger are can increase the amount of information that can be provided at a time and attracts more attention, so that the effect of advertising can be increased, for example.

A touch panel is preferably used in the display portion 7500 so that the user can operate the digital signage. Thus, the digital signage can be used not only for advertising but also for providing information that the user needs, such as route information, traffic information, and guidance information on a commercial facility.

In addition, as shown in FIGS. 16(C) and 16(D), it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311, or display on the display portion 7500 can be switched by operation of the information terminal 7311.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIGS. 16(A) to 16(D).

The electronic devices of this embodiment each include a display portion; however, one embodiment of the present invention can also be used in an electronic device without a display portion.

At least part of this embodiment can be implemented in combination with the other embodiments described in this specification as appropriate.

REFERENCE NUMERALS

100: transistor, 100A: transistor, 102: substrate, 103: insulating layer, 103*d*: region, 106: conductive layer, 106*c*: conductive layer, 106*d*: region, 108: semiconductor layer, 108*c*: semiconductor layer, 108*n*: region, 110: insulating layer, 110*d*: region, 112: conductive layer, 112*d*: region, 112*f*: conductive film, 114: metal oxide layer, 114*f*: metal oxide film, 116: insulating layer, 116*a*: insulating layer, 116*b*: insulating layer, 118: insulating layer, 120*a*: conductive layer, 120b: conductive layer, 130A: capacitor, 130B: capacitor, 140: impurity element, 141a: opening portion, 141b: opening portion, 142: opening portion

The invention claimed is:

1. A method for manufacturing a semiconductor device, comprising steps of:
   forming a semiconductor layer containing a metal oxide;
   forming a first insulating layer over the semiconductor layer;
   forming a first conductive film over the first insulating layer;
   etching part of the first conductive film to form a first conductive layer, thereby forming a region in which the first conductive layer overlaps with the semiconductor layer;
   performing first treatment on the first conductive layer; and
   forming a second insulating layer containing an oxide, the second insulating layer being in contact with the first conductive layer,
   wherein the first conductive layer contains copper, silver, gold, or aluminum,
   wherein the first treatment is plasma treatment in an atmosphere including a mixed gas of a first gas containing an oxygen element but not containing a hydrogen element, and a second gas containing a hydrogen element but not containing an oxygen element,
   wherein the second insulating layer is formed by a plasma-enhanced chemical vapor deposition method using a film formation gas containing the first gas and a third gas containing a silicon element, and
   wherein the second insulating layer is formed successively after the first treatment without exposure to the air.

2. The method for manufacturing a semiconductor device according to claim 1, further comprising steps of:
   forming a first metal oxide film over the first insulating layer; and
   etching part of the first metal oxide film to form a first metal oxide layer in the step of etching the part of the first conductive film.

3. The method for manufacturing a semiconductor device according to claim 1,
   wherein the first treatment is performed while the flow rates of the first gas and the second gas supplied to a treatment chamber are controlled such that a flow rate of the second gas is higher than or equal to 0.5% and lower than or equal to 100% with a flow rate of the first gas being 100%.

4. The method for manufacturing a semiconductor device according to claim 1,
   wherein the first gas contains $N_2O$ or $O_2$, and
   wherein the second gas contains $NH_3$ or $H_2$.

5. The method for manufacturing a semiconductor device according to claim 1,
   wherein the formation of the second insulating layer and the first treatment are performed in the same treatment chamber and at the same temperature.

6. The method for manufacturing a semiconductor device according to claim 1,
   wherein the semiconductor layer comprises a stack of a first layer and a second layer, and
   wherein crystallinity of the second layer is higher than crystallinity of the first layer.

7. The method for manufacturing a semiconductor device according to claim 1, further comprising steps of:
   forming a second conductive layer; and
   forming a third insulating layer over the second conductive layer,
   wherein the semiconductor layer overlaps with the second conductive layer with the third insulating layer therebetween.

8. A method for manufacturing a semiconductor device, comprising steps of:
   forming a semiconductor layer containing a metal oxide;
   forming a first insulating layer over the semiconductor layer;
   forming a first gate electrode over the first insulating layer;
   performing first treatment on the first gate electrode; and
   forming a second insulating layer over the first gate electrode,
   wherein the first treatment is plasma treatment in an atmosphere including a mixed gas of a first gas containing an oxygen element but not containing a hydrogen element and a second gas containing a hydrogen element but not containing an oxygen element, and
   wherein the first gate electrode contains copper, silver, gold, or aluminum.

9. The method for manufacturing a semiconductor device according to claim 8, further comprising steps of:
   forming a first metal oxide film over the first insulating layer; and
   etching part of the first metal oxide film to form a first metal oxide layer below the first gate electrode.

10. The method for manufacturing a semiconductor device according to claim 8,
    wherein the first treatment is performed while the flow rates of the first gas and the second gas supplied to a treatment chamber are controlled such that a flow rate of the second gas is higher than or equal to 0.5% and lower than or equal to 100% with a flow rate of the first gas being 100%.

11. The method for manufacturing a semiconductor device according to claim 8,
    wherein the first gas contains $N_2O$ or $O_2$, and
    wherein the second gas contains $NH_3$ or $H_2$.

12. The method for manufacturing a semiconductor device according to claim 8,
    wherein the formation of the second insulating layer and the first treatment are performed in the same treatment chamber and at the same temperature.

13. The method for manufacturing a semiconductor device according to claim 8,
    wherein the semiconductor layer comprises a stack of a first layer and a second layer, and
    wherein crystallinity of the second layer is higher than crystallinity of the first layer.

14. The method for manufacturing a semiconductor device according to claim 8, further comprising steps of:
    forming a second gate electrode; and
    forming a third insulating layer over the second gate electrode,
    wherein the semiconductor layer overlaps with the second gate electrode with the third insulating layer therebetween.

* * * * *